(12) United States Patent
Islam et al.

(10) Patent No.: US 7,563,648 B2
(45) Date of Patent: Jul. 21, 2009

(54) SEMICONDUCTOR DEVICE PACKAGE AND METHOD FOR MANUFACTURING SAME

(75) Inventors: Shafidul Islam, Plano, TX (US); Daniel K. Lau, San Francisco, CA (US); Romarico S. San Antonio, Batam Island (ID); Anang Subagio, Batam Island (ID); Michael H. McKerreghan, Farmers Branch, TX (US); Edmunda G-O. Litilit, Baguio (PH)

(73) Assignee: Unisem (Mauritius) Holdings Limited, Port Louis (MU)

( * ) Notice: Subject to any disclaimer, the term of this patent is extended or adjusted under 35 U.S.C. 154(b) by 309 days.

(21) Appl. No.: 10/563,712

(22) PCT Filed: Aug. 11, 2004

(86) PCT No.: PCT/US2004/026152

§ 371 (c)(1),
(2), (4) Date: Aug. 18, 2006

(87) PCT Pub. No.: WO2005/017968

PCT Pub. Date: Feb. 24, 2005

(65) Prior Publication Data

US 2007/0161157 A1    Jul. 12, 2007

Related U.S. Application Data

(60) Provisional application No. 60/494,982, filed on Aug. 14, 2003.

(51) Int. Cl.
*H01L 21/00* (2006.01)
*H01L 23/48* (2006.01)

(52) U.S. Cl. .......... 438/124; 438/106; 438/111; 438/112; 438/121; 438/123; 257/670; 257/692; 257/694; 257/E21.001; 257/E23.043

(58) Field of Classification Search .......... 257/670, 257/692, 694, E23.043, E23.066; 438/106
See application file for complete search history.

(56) References Cited

U.S. PATENT DOCUMENTS 5,263,246 A * 11/1993 Aoki .................. 29/843
6,238,952 B1 * 5/2001 Lin ................... 438/110

(Continued)

FOREIGN PATENT DOCUMENTS

EP    0 348 018 A2    12/1989
WO   WO 2004/001847 A1    12/2003

*Primary Examiner*—Alexander G Ghyka
*Assistant Examiner*—Angel Roman
(74) *Attorney, Agent, or Firm*—Wiggin and Dana LLP

(57) ABSTRACT

A lead frame (52, 100, 112) for a semiconductor device (die) package (50, 102, 110) is described. Each of the leads (60) in the lead frame (52, 100, 112) includes an interposer (64) having one end (66) disposed proximate the outer face (58) of the package (50, 102, 110) and another end (68) disposed proximate the die (14). Extending from opposite ends of the interposer (64) are a board connecting post (70) and a support post (74). A bond site (78) is formed on a surface of the interposer (64) opposite the support post (74). Each of the leads (60) is electrically connected to an associated input/output (I/O) pad (80) on the die (14) via wirebonding, tape bonding, or flip-chip attachment to the bond site (78). Where wirebonding is used, a wire electrically connecting the I/O pad (80) to the bond site (78) may be wedge bonded to both the I/O pad (80) and the bond site (78). The support post (74) provides support to the end (68) of the interposer (64) during the bonding and coating processes.(FIG. 3).

33 Claims, 28 Drawing Sheets

U.S. PATENT DOCUMENTS

| | | | |
|---|---|---|---|
| 6,299,057 B1 * | 10/2001 | Ball | 228/180.5 |
| 6,437,429 B1 | 8/2002 | Su et al. | |
| 6,452,255 B1 | 9/2002 | Bayan et al. | |
| 6,521,987 B1 * | 2/2003 | Glenn et al. | 257/684 |
| 6,650,020 B2 * | 11/2003 | Yamada et al. | 257/783 |
| 6,759,737 B2 * | 7/2004 | Seo et al. | 257/686 |
| 6,767,761 B2 | 7/2004 | Honda | |
| 6,812,552 B2 | 11/2004 | Islam et al. | |
| 6,830,954 B2 | 12/2004 | Williams | |
| 6,838,752 B2 * | 1/2005 | Diot | 257/666 |
| 6,940,154 B2 * | 9/2005 | Pedron et al. | 257/666 |
| 7,033,517 B1 * | 4/2006 | Fan et al. | 216/13 |
| 7,042,068 B2 * | 5/2006 | Ahn et al. | 257/666 |
| 7,154,186 B2 * | 12/2006 | Noquil et al. | 257/778 |
| 2001/0045625 A1 * | 11/2001 | Sakamoto et al. | 257/666 |
| 2002/0031869 A1 | 3/2002 | Minamio et al. | |
| 2002/0041011 A1 | 4/2002 | Shibata | |

* cited by examiner

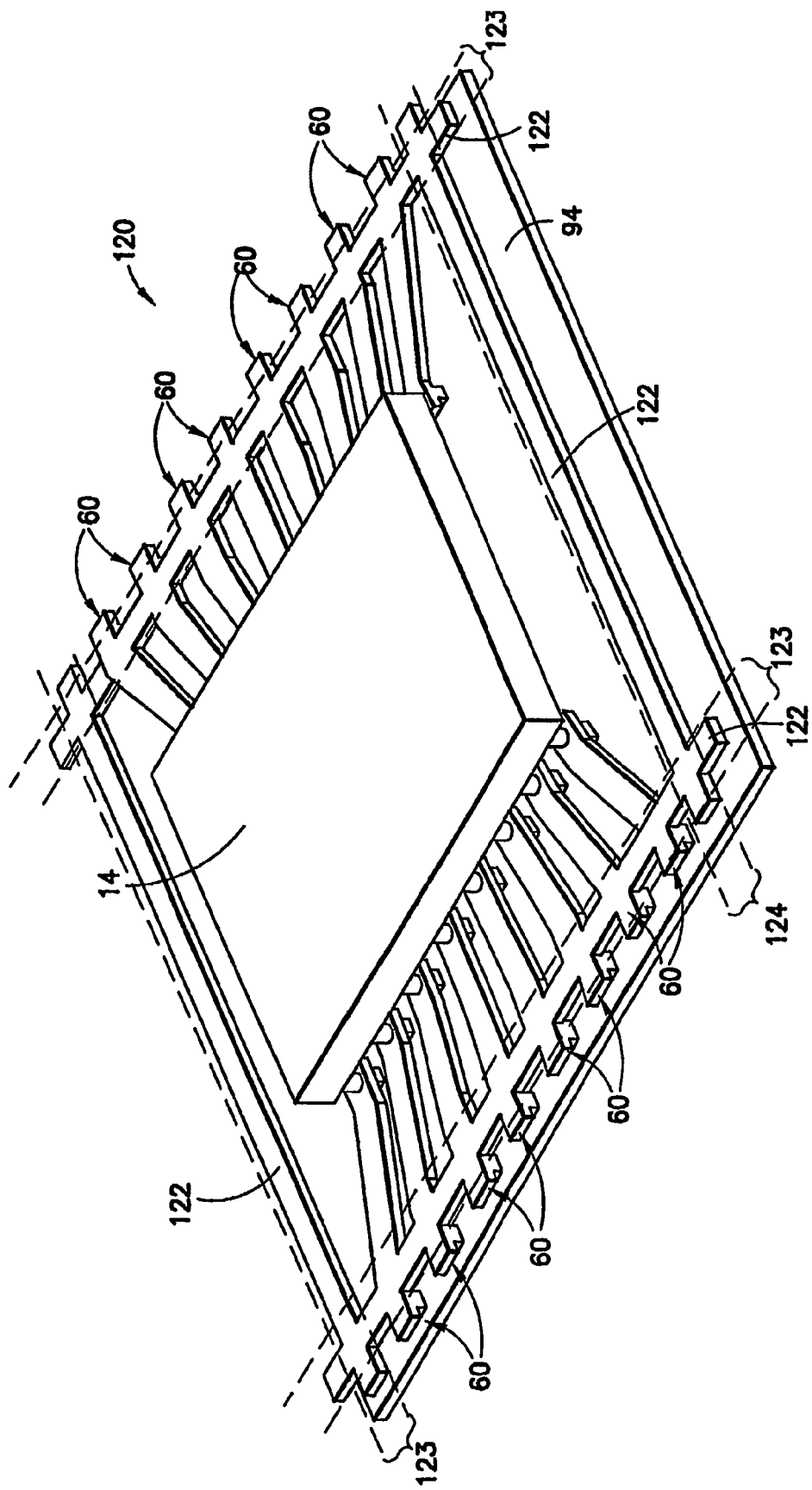

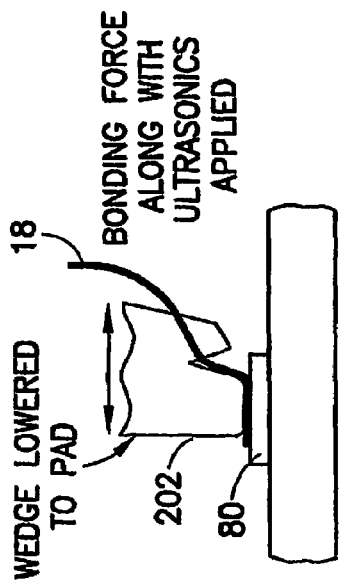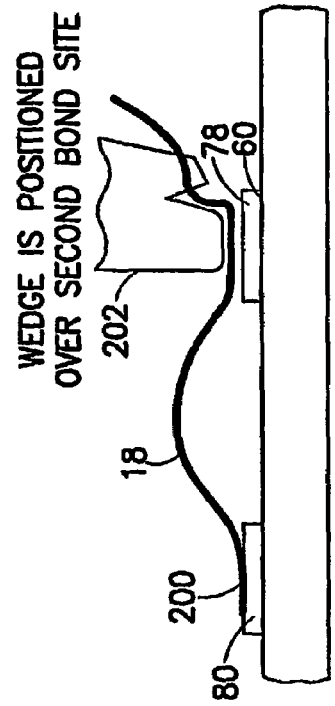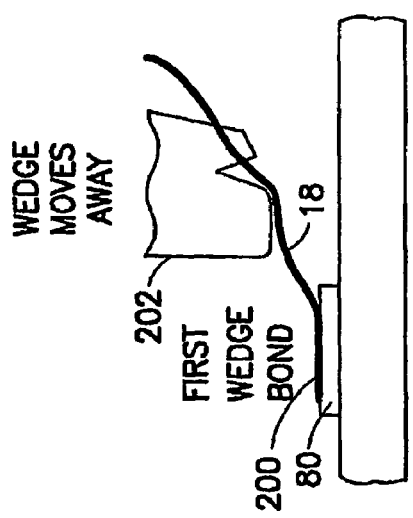

SEMICONDUCTOR DEVICE PACKAGE AND METHOD FOR MANUFACTURING SAME

CROSS-REFERENCE TO RELATED APPLICATION

This application claims the benefit of U.S. Provisional Patent Application No. 60/494,982, filed Aug. 14, 2003, which is incorporated by reference herein in its entirety.

BACKGROUND OF THE INENTION

1. Field of the Invention

This invention relates to semiconductor device packages. More particularly, this invention relates to lead frame based semiconductor device packages and methods for manufacturing lead frame based semiconductor device packages.

2. Description of the Related Art

In lead frame based semiconductor device packages, electrical signals are transmitted between at least one semiconductor device (die) and external circuitry, such as a printed circuit board, by an electrically conductive lead frame. The lead frame includes a number of leads, each having an inner lead end and an opposing outer lead end. The inner lead end is electrically connected to input/output (I/O) pads on the die, and the outer lead end provides a terminal outside of the package body. Where the outer lead end terminates at the face of the package body, the package is known as a "no-lead" package, while if the outer leads extend beyond the package body perimeter the package is referred to as "leaded". Examples of well-known no-lead packages include quad flat no-lead (QFN) packages, which have four sets of leads disposed around the perimeter of the bottom of a square package body, and dual flat no-lead (DFN) packages, which have two sets of leads disposed along opposite sides of the bottom of a package body. A method for the manufacture of a QFN package is disclosed in commonly owned published United States patent application publication number US 2003/0203539 A1 that was filed on Apr. 29, 2002 and is incorporated by reference in its entirety herein.

Connection of the die to the inner lead ends is typically performed using wire bonding, tape automated bonding (TAB), or flip-chip methods. In wirebonding or TAB methods, the inner lead ends terminate a distance from the die and are electrically interconnected to I/O pads on the top of the die by small diameter wires or conductive tape. The die may be supported by a support pad, which is surrounded by the leads. In the flip-chip method, the inner lead ends of the lead-frame extended beneath the die, and the die is flipped such that the I/O pads on the die contact the inner lead ends through a direct electrical connection (e.g., a solder connection).

In no-lead packages employing wirebonding, the leads are typically formed in one of two general configurations. In a first configuration, shown in FIG. 1, each lead 10 consists substantially of a post disposed proximate a side face of the package. A support pad 12 is typically disposed between the leads 10 for supporting a die 14. The leads 10 and support pad 12 may include locking features, such as tabs 16 protruding outward from the lead 10 and support pad 12, which cooperate with a molding compound to retain the lead 10 and support pad 12 within the package. One drawback to this configuration is that it requires a relatively long length of bond wire 18 to connect I/O pads on the die 14 to the leads 10. The use of longer lengths of bond wire 18 adversely affects package performance by increasing the electrical resistance between the die 14 and the lead 10. Also, the bond wire 18 is relatively expensive and fragile and, therefore, the use of greater amounts of bond wire 18 is undesirable. This problem is exacerbated by the industry trend toward the use of smaller and smaller die sizes for the same size package, which increases the length of bond wire 18 for a given package size.

In a second general configuration for wirebonded, no-lead packages, shown in FIG. 2, the lead 10 includes an interposer 20, which extends from the board connecting post toward the die support pad 12. The interposer 20 reduces the length of bond wire 18 needed, thus overcoming some of the problems of the configuration of FIG. 1. However, the configuration of FIG. 2 is itself problematic in that it is difficult to maintain the coplanarity of the bond sites on the interposer 20 when bonding the die to the leads.

No-lead packages employing flip-chip bonding methods typically use a configuration similar to that shown in FIG. 2 without the support pad 12. The interposers 20 extend beneath the die 14, and the die is flipped such that I/O pads on the die 14 can be soldered to the bond sites on the interposers 20. The use of this configuration for flip-chip bonding methods also presents the problem of maintaining coplanarity of the bond sites on the interposers 20 when bonding the die 14 to the leads 10.

Where wirebonding is used, the bond wires 18 are typically attached using one of three wirebonding techniques: ultrasonic bonding, thermocompression bonding, and thermosonic bonding.

In ultrasonic bonding, a combination of pressure and ultrasonic vibration bursts are applied to form a metallurgical cold weld. Ultrasonic bonding forms what is known as a "wedge bond". In a wedge bond, the bond occurs along a side surface of the wire 18, with the wire 18 extending generally parallel to a surface of the lead 10, as shown at 19 in FIG. 2.

In thermocompression bonding, a combination of pressure and elevated temperature are applied to form a weld. Thermosonic bonding, on the other hand, uses a combination of pressure, elevated temperature, and ultrasonic vibration bursts are applied to form a weld. Thermocompression and thermosonic bonding techniques typically form what is known as a "ball bond" at the I/O pad and a wedge bond at the lead 10. In a ball bond, the bond occurs at the end of the wire 18, with the wire 18 extending generally perpendicular to the surface of the I/O pad at the connection site, as shown at 21 in FIG. 2. Practically all thermocompression and thermosonic bonding is performed using gold or gold alloy wire.

In modern packaging techniques, a matrix of interconnected lead frames is used to allow a number of packages to be manufactured at the same time. Such techniques generally include securing a die 14 to the central support pad 12 of each lead frame in the matrix using solder, epoxy, double-sided adhesive tape, and the like. The leads 10 for each lead frame are then wirebonded to I/O pads on the associated die 14. After wirebonding, the die 14, bond wires 18, and at least a portion of the leads 10 are encapsulated in plastic using, for example, a transfer or injection molding process. The packages are then singulated by sawing with a blade, water jet, or the like, leaving portions of the leads 1 0 of each package exposed for electrical connection to an external circuit.

The use of ultrasonic bonding in such modern encapsulation techniques is problematic for a number of reasons. For example, the leads 10 formed on modern lead frames are very thin and are therefore easily broken by the aluminum wedge bonding process. As a result of such limitations, the use of aluminum wedge bonding has been reserved for individualized, hermetic packages, which provide solid bonding posts and where the package can be precisely rotated and positioned during the aluminum wedge bonding process.

BRIEF SUMMARY OF THE INVENTION

The above-described and other drawbacks and deficiencies of the prior art are overcome or alleviated by a semiconductor device package including a molding compound forming at least a portion of a first package face, a semiconductor device at least partially covered by the molding compound, and a lead frame of electrically conductive material at least partially covered by the molding compound. The lead frame includes a plurality of leads. Each of the leads includes an interposer having a board connecting post and a support post extending from the interposer. Both the board connecting post and the support post terminate at the first package face, and the interposer is spaced apart from the first package face. In each lead, a bond site is formed on a surface of the interposer opposite the support post. At least one of the I/O pads is electrically connected to the interposer at the bond site. The I/O pads may be wire or tape bonded to the bond site, or the I/O pads maybe directly electrically connected to the bond site for forming a flip-chip type connection.

In one embodiment, the molding compound forms at least a portion of a second package face adjacent to the first package face, and a side surface of the board connecting post adjacent the end surface of the board connecting post is visible at the second package face. A corner between the side surface of the board connecting post and the end surface of the board connecting post may be removed to form a relief, the relief having a height of between about 1 mil to about 2 mils measured from the end surface of the board connecting post.

In another aspect of the invention, a method of packaging a semiconductor device comprises: (a) forming a lead frame from electrically conductive material, the lead frame including a plurality of leads, each of the leads including: an interposer having opposing first and second ends, a board connecting post extending from the interposer proximate the first end, the board connecting post having a free end distal from the interposer, a support post spaced apart from the board connecting post and extending from the interposer proximate the second end, the support post having a free end distal from the interposer, and a bond site formed on a surface of the interposer opposite the support post; (b) supporting the free ends of the support post and the board connecting post; (c) electrically connecting I/O pads on the semiconductor device to the bond sites while supporting the free ends of the support post and the board connecting post; and (d) covering at least a portion of the semiconductor device, and at least a portion of the lead frame with a molding compound while supporting the free ends of the support post and the board connecting post.

Electrically connecting the I/O pads to the bond sites may include wire bonding the I/O pads to the bond sites or directly electrically connecting the I/O pads to the bond sites to form a flip-chip type connection. Supporting the free ends of the support post and the bond connecting post may include adhering the free ends of the support post and the bond connecting post to a surface. In one embodiment, forming the lead frame includes: (a) forming a lead frame precursor from electrically conductive material, the lead frame precursor including a plurality of lead precursors, each of the lead precursors being a strip of the conductive material; and (b) disposing a channel across each of the lead precursors to form the plurality of leads. The method may further comprise filling the channel with resin.

In another aspect of the invention, a semiconductor device package includes a molding compound forming at least a portion of a first package face, a semiconductor device at least partially covered by the molding compound, and a lead frame of electrically conductive material at least partially covered by the molding compound. The lead frame includes a plurality of leads, each of which has a bond site formed thereon. Each bond site is electrically connected to a corresponding I/O pad on the semiconductor device by a wire, which is wedge bonded to both the I/O pad and the bond site. The wire may be made from aluminum or aluminum base alloy, and may have a wedge width between about 1.2 to about 1.5 times a diameter of a portion of the wire extending between the I/O pad and the bond site. In one embodiment, the lead frame is etched to separate the leads after the molding compound is applied to the lead frame.

In yet another aspect of the invention, a method of packaging a semiconductor device comprises: forming a lead frame from electrically conductive material, the lead frame including a plurality of leads; electrically connecting I/O pads on the semiconductor device to bond sites on the leads; and covering at least a portion of the semiconductor device, and at least a portion of the lead frame with a molding compound. Electrically connecting the I/O pads to the bond sites includes: wedge bonding a wire to the I/O pad, and wedge bonding the wire to the bond site. The wire may be made from aluminum or an aluminum base alloy, and may have a wedge width between about 1.2 to about 1.5 times a diameter of a portion of the wire extending between the I/O pad and the bond site. In one embodiment, the lead frame is etched to separate the leads after the molding compound is applied to the lead frame.

The details of one or more embodiments of the invention are set forth in the accompanying drawings and the description below. Other features, objects and advantages of the invention will be apparent from the description and drawings, and from the claims.

BRIEF DESCRIPTION OF THE DRAWINGS

The invention will be more fully understood from the following detailed description taken in conjunction with the accompanying drawings wherein like elements are numbered alike, and in which:

FIG. 13 is a top perspective view of a lead frame bonded to a die for a dual, no-lead, flip-chip semiconductor device package in accordance with another embodiment of the present invention;

FIG. 16 is a cross-sectional view of a wirebonded semiconductor device package employing the alternative lead configuration of FIG. 14a;

FIGS. 26a-h depict a wedge bonding sequence for wirebonding in encapsulated integrated circuit chip packaging;

DETAILED DESCRIPTION

Figure 3:
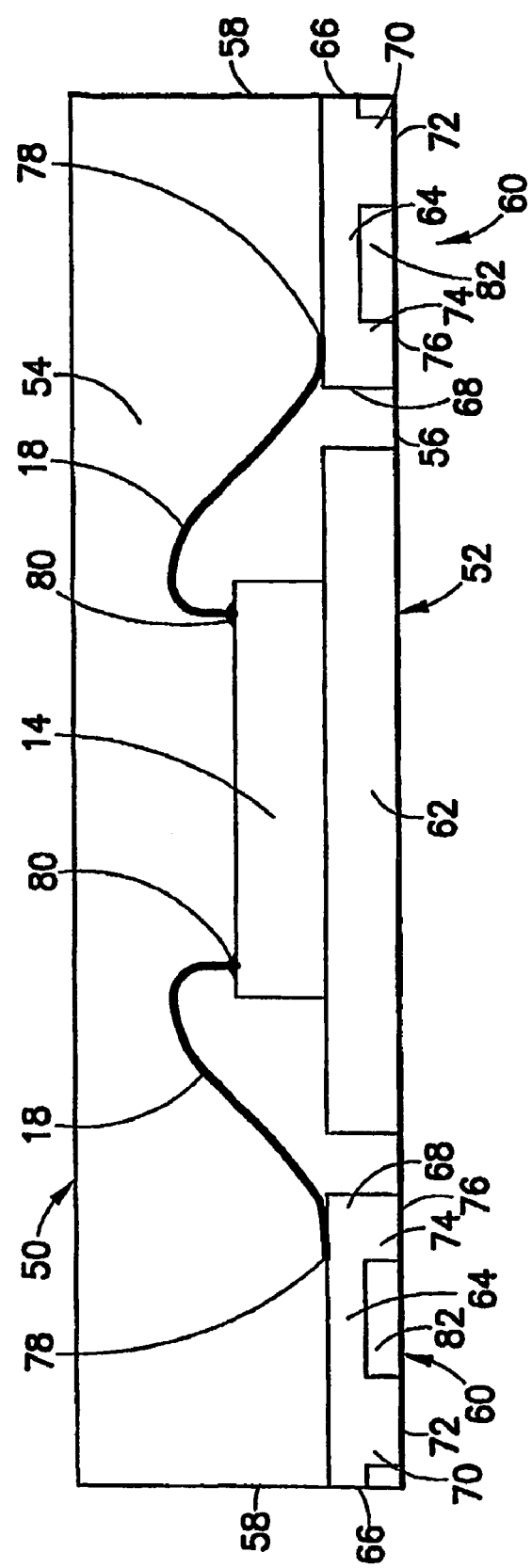
FIG. 3 is a cross-sectional view of a quad, no-lead, wirebonded semiconductor device package in accordance with an embodiment of the present invention.

Referring to FIG. 3, a cross-sectional view of a quad, no-lead, wirebonded semiconductor device package 50 is shown. The semiconductor device package 50 includes a semiconductor device (die) 14 and a lead frame 52 covered by a molding compound 54, which forms a portion of outer faces 56 and 58 of the package 50. The lead frame 52 includes a plurality of leads 60 and a die pad 62 disposed between the leads 60. Each of the leads 60 includes an interposer 64 having one end 66 disposed proximate an outer face 58 of the package 50 and another end 68 disposed proximate the die 14. Extending from each interposer 64 proximate the end 66 is a board connecting post 70, which has a free end 72 that terminates at the package face 56. Extending from each interposer 64 proximate the opposite end 68 is a support post 74, which is spaced apart from the board connecting post 70 and has a free end 76 that terminates at the package face 56. Each of the leads 60 includes a bond site 78 formed on a surface of the interposer 64 opposite the support post 74. Each of the leads 60 is electrically connected to an associated input/output (I/O) pad 80 on the die 14 via a bond wire 18 connected between the I/O pad 80 and the bond site 78. The free end 72 of the board connecting post 70 may be electrically connected to an external circuit, such as a printed circuit board or another semiconductor device package. Electrical signals are transmitted between the die 14 and the external circuitry via the I/O pad 80, bond wire 18, interposer 64 and board connecting post 70. As will be described in further detail hereinafter, the support post 74 provides support to the end 68 of the interposer 64 during the bonding and coating processes. Also, a channel 82 defined by the interposer 64, the support post 74, and the board connecting post 70 accepts the molding compound 54 to aid in locking each lead 60 within the package 50. The board connecting post 70 may also be offset from the end 66 of the interposer 64 such that the end 66 acts as a tab for anchoring the lead 60 within the molding compound 54.

Figure 4:
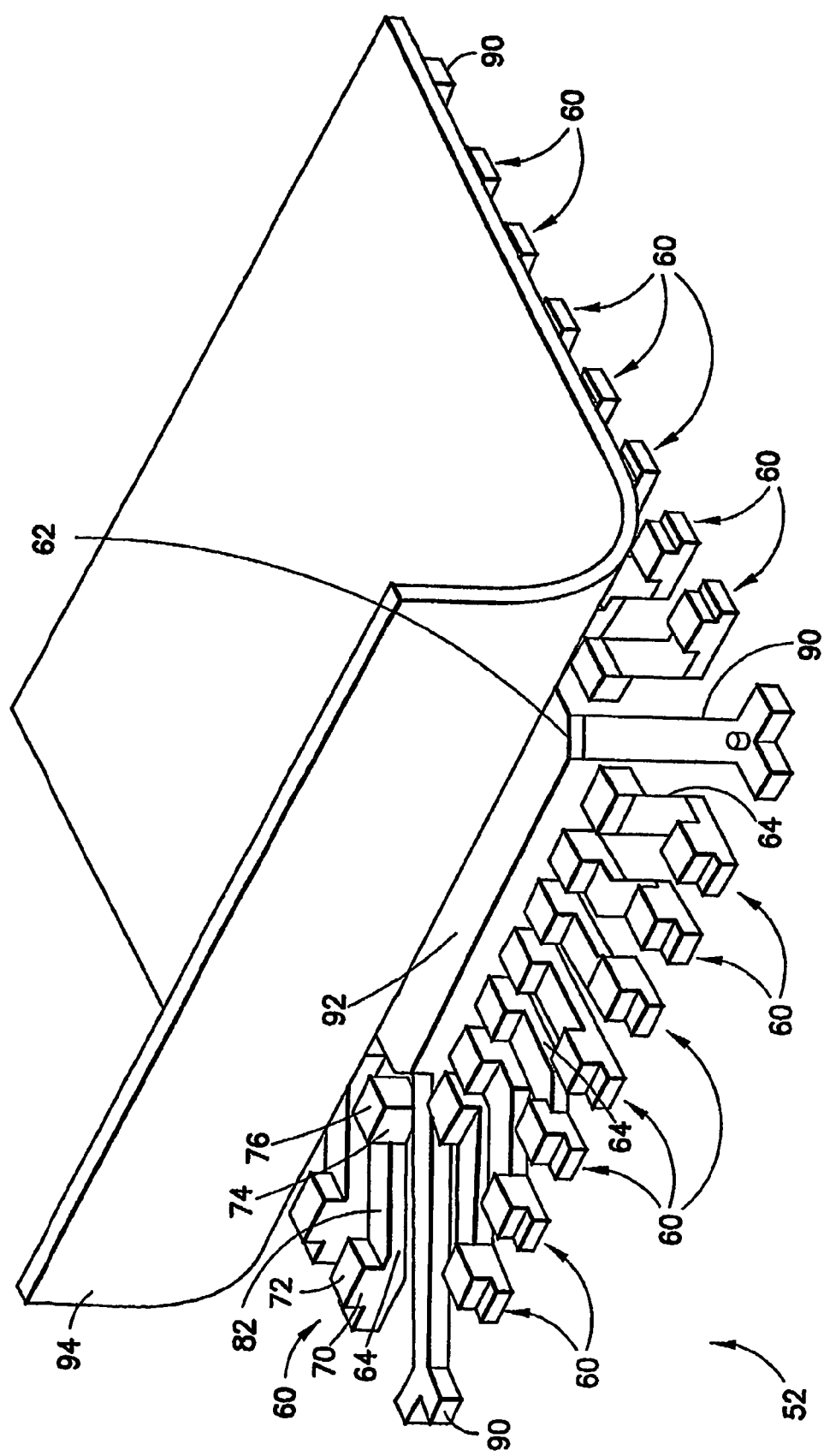
FIG. 4 is a bottom perspective view of a lead frame of the semiconductor device package of FIG. 3.

Referring to FIG. 4, a bottom perspective view of the lead frame 52 is shown. In the embodiment shown, seven leads 60 are disposed on each of the four sides of the die support pad 62. It will be appreciated, however, that the number and location of the leads 60 may be modified as needed for a particular application. The leads 60 are spaced apart from each other and from the die support pad 62 to electrically isolate the leads 60 from each other and from the die support pad 62. Each of the interposers 64 is shaped to adjust pitch between adjacent leads 60. For example, the centermost interposer 64 on each side is substantially straight, while the outermost interposer 64 on each side is angularly shaped.

Extending from each corner of the die pad 62 is a tie bar 90, which acts to anchor the die pad 62 within the molding compound 54 (FIG. 3).

The lead frame 52 may be formed from a sheet of any suitable electrically conductive material, preferably copper or a copper base alloy. By copper base alloy it is meant that the material contains more than 50%, by weight, of copper. The sheet of conductive material forming the lead frame 52 preferably has a thickness of between about 0.10 mm to about 0.25 mm, and more preferably between about 0.15 mm to about 0.20 mm. Precursors for each of the features of the lead pad, including the die support pad 62, the leads 60, and tie bars 90 may be formed using any known method such as stamping, chemical etching, laser ablation, or the like. The various recesses formed in each of these features may then be formed using a controlled subtractive process such as chemical etching or laser ablation. For example, each surface intended to form the free ends 76, 72 of the support post 74 and the board connecting post 70 may be coated with a chemical resist and the uncoated surface exposed to a suitable etchant for a time effective to form channels 82. The same method may be used to recess the tie bars 90 from a bottom surface 92 of the die support pad 62. The channels 82 are preferably etched across the lead precursors to a depth of between about 40% to about 75% of the thickness of the lead frame 52 (i.e., the thickness of the material used to form the lead frame), and more preferably between about 50% to about 60% of this thickness. Channel depths within this preferred range provide interposers 64 having sufficient electrical conductivity while allowing sufficient clearance in the channel 82 to accept the molding compound 54 (FIG. 3).

After the various recesses (e.g., channels 82) have been formed, the free ends 76, 72 of the support posts 74 and the board connecting posts 70 and the bottom surface 92 of the chip support pad 62 are adhered to a surface 94. In the embodiment shown, the surface 94 is formed on an adhesive tape, which contacts and secures the substantially coplanar surfaces formed on the free ends 76, 72 of the support posts 74 and board connecting posts 70 and the bottom surface 92 of the support pad 92. While FIG. 4 shows a single lead frame 52, it will be appreciated that a plurality of interconnected lead frames 52 may be provided, with the interconnected lead frames 52 may be provided, with the interconnected frames 52 being singulated by sawing with a blade, water jet, or the like, typically as the final step in the manufacturing process.

Figure 5:
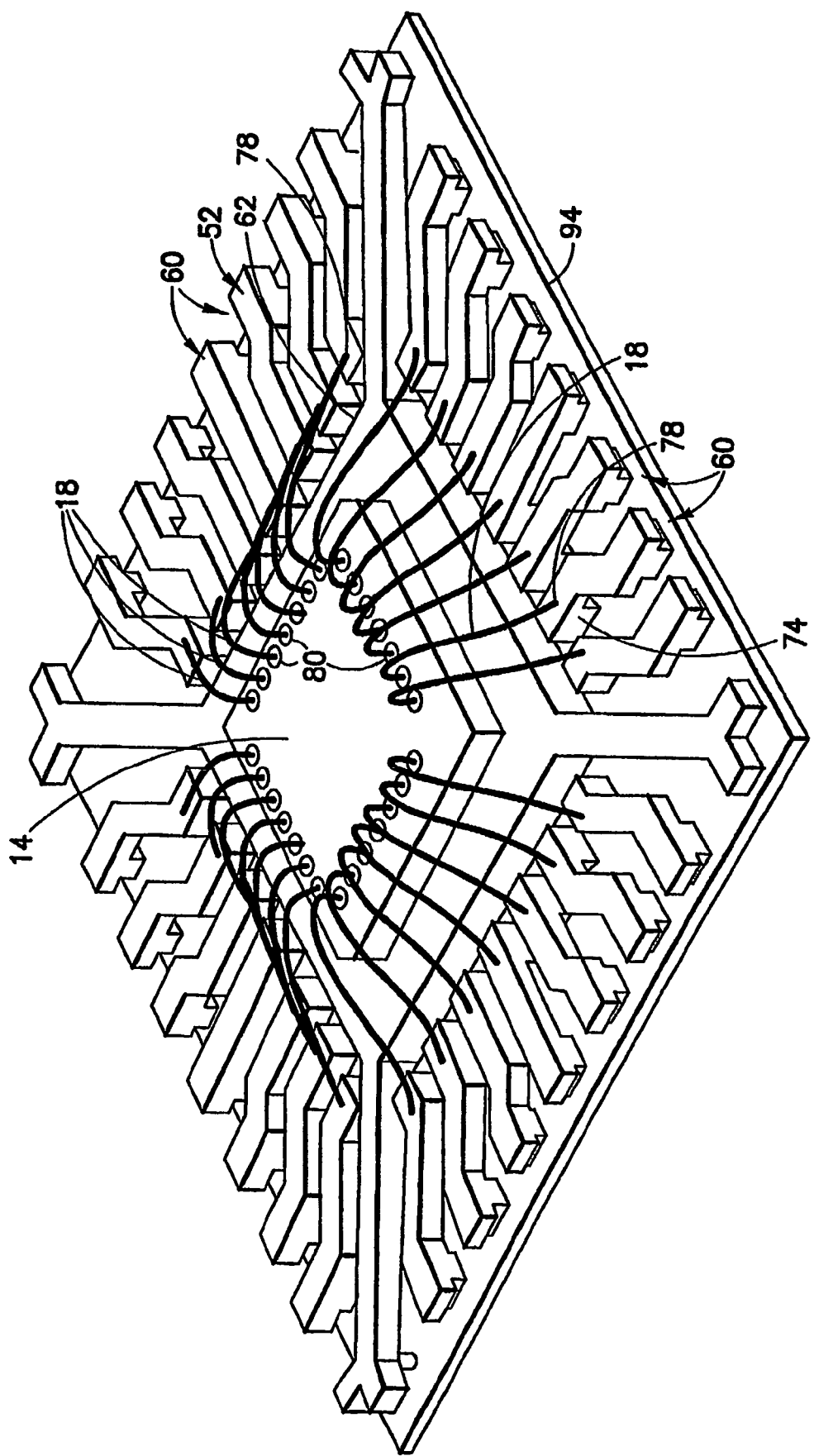
FIG. 5 is a top perspective view of the lead frame of FIG. 4 wirebonded to a die.

Referring to FIG. 5, a top perspective view of the lead frame 52 is shown, with the lead frame 52 being wirebonded to a die 14. The die 14 is secured to the support pad 62 using any convenient method, such as solder, epoxy, double-sided adhesive tape, and the like. After the die 14 is secured to the support pad 62, wires 18 are individually connected between I/O pads 80 on the die 14 and the bond sites 78 on the respective leads 60. The support posts 74 maintain coplanarity of the bond sites 78 in each of the leads 60, allowing precise bonding of the wires 18 to the bond sites 78 and, therefore, reducing defects in the manufacture of the package. In addition, the support posts 74 transmit the force associated with the bonding of the wire 18 from the bond site 78 to the surface 94. Because the support posts 74 and bond site 78 are supported, the leads 60 of the present invention allow a wider variety of bonding methods and wire materials to be used than was possible with lead frame designs of the prior art. As will be described hereinafter, the wirebonding may be performed using ultrasonic bonding, where a combination of pressure and ultrasonic vibration bursts are applied to form a metallurgical cold weld, thermocompression bonding, where a combination of pressure and elevated temperature are applied to form a weld, or thermosonic bonding where a combination of pressure, elevated temperature, and ultrasonic vibration bursts are applied to form a weld.

As will be described in further detail hereinafter, a robust intermediate formed by partial etching of package features may enable use of ultrasonic bonding to form a wedge bond at both the bond pad and lead. The type of wire used in the bonding is preferably made from gold, gold based alloy, aluminum, or aluminum based alloy.

As an alternative to wirebonding, tape automated bonding (TAB) may be used.

Figure 6:
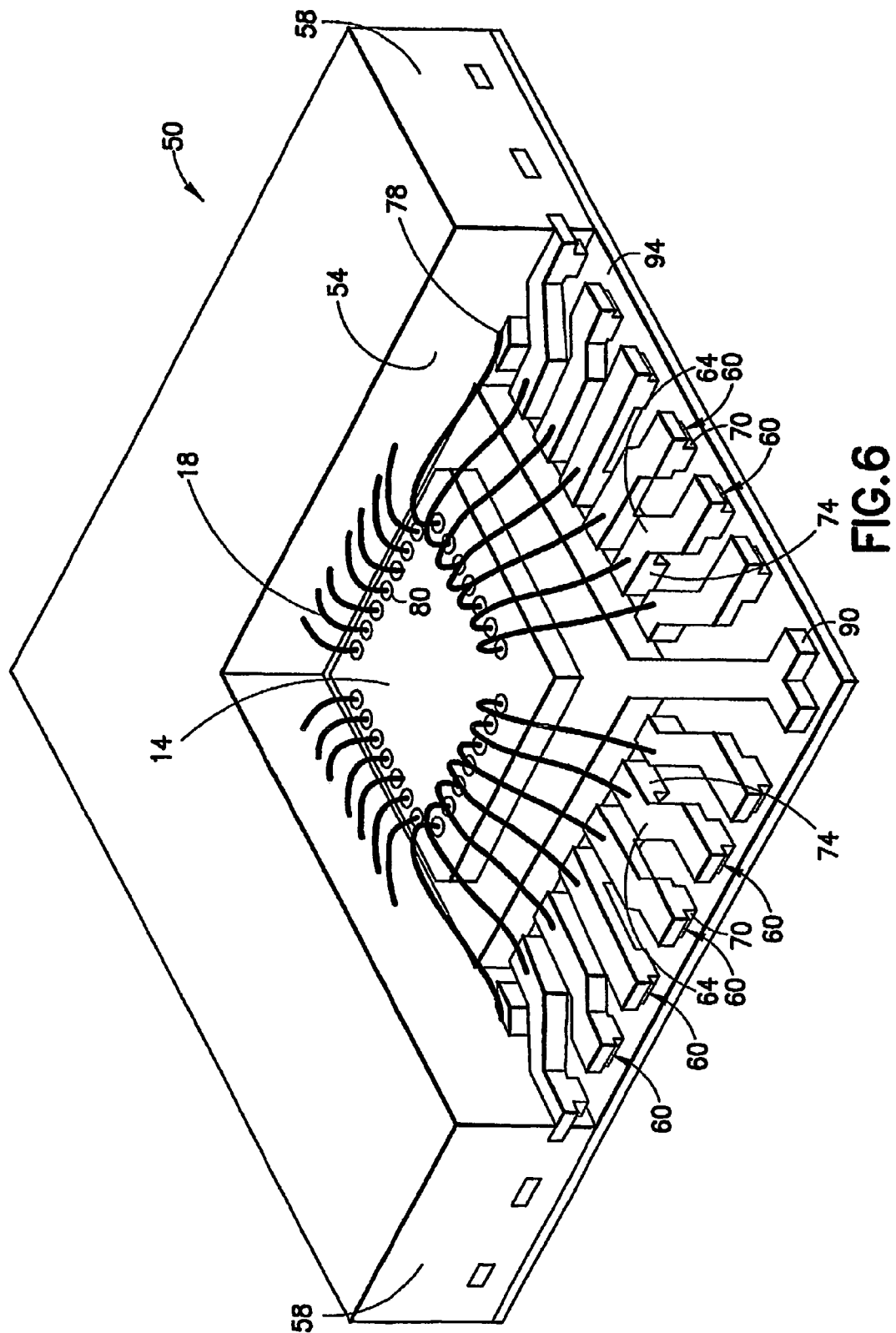
FIG. 6 is a partial cut-away, top perspective view of the semiconductor device package of FIG. 3.

After the I/O pads 80 have been wirebonded to their associated bond sites 78, the die 14, lead frame 52, and bond wires 18 are covered with the molding compound 54, as shown in FIG. 6. The molding compound 54 may be applied using any convenient technique, such as a transfer or injection molding process. The molding compound 54 is an electrically insulative material, preferably a polymer molding resin, such as an epoxy, having a flow temperature in the range of between about 250° C. to about 300° C. The molding compound 54 may also be a low temperature thermal glass composite.

During application of the molding compound 54, the support posts 74 and board connecting posts 70, which are adhered to the surface 94, prevent movement of the interposer 64 and, therefore, maintain the spacing between the leads 60 and help to ensure that the wirebond at the bond site 78 is not disturbed or broken. In addition, the channels 82 (FIG. 3) formed beneath the interposers 64 accept the molding compound 54, which anchors the interposer 64, support post 74, and board connecting post 70 within the package 50.

Figure 7:
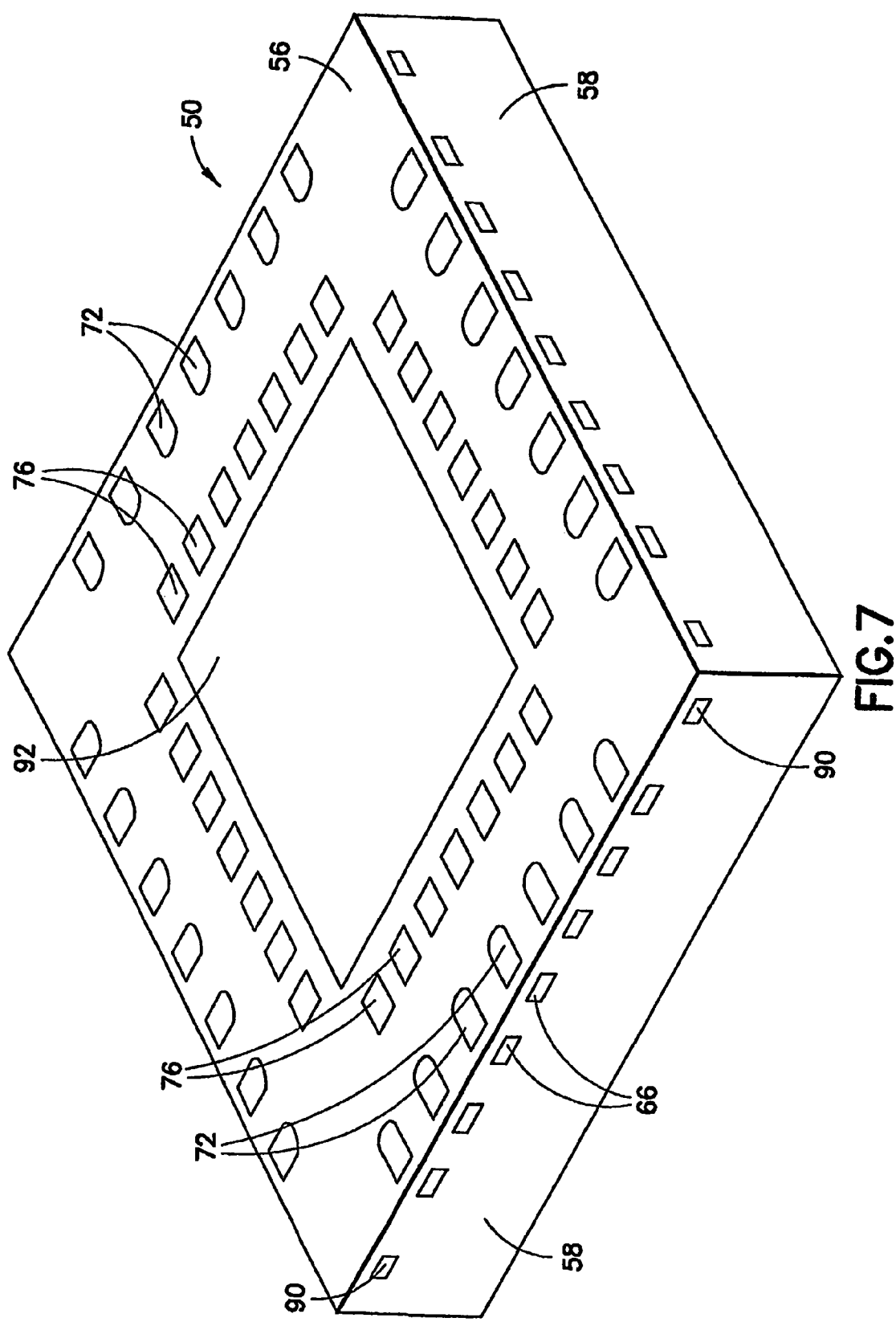
FIG. 7 is a bottom perspective view of the semiconductor device package of FIG. 3.

After the bond sites 78, die 14, and lead frame 52 are coated, the adhered surface 94 is removed and, if necessary, the attached packages 50 are singulated by sawing with a blade, water jet, or the like. Referring to FIGS. 3 and 7, after removal of the adhered surface 94 and singulation, portions of the lead frame 52 of each package 50 are exposed. In particular, the free ends 76 of the support posts 74, the free ends 72 of the board connecting posts 70, ends 66 of the interposers 64, ends of the tie bars 90, and the bottom surface 92 of the support pad 62 may be exposed. In a typical arrangement, only the free ends 72 of the board connecting posts 70 will be used for connection to an external electrical circuit. However, the free ends 76 of the support posts 74 and the ends 66 of the interposers 64 may also be connected to an external circuit if desired.

Figure 8:
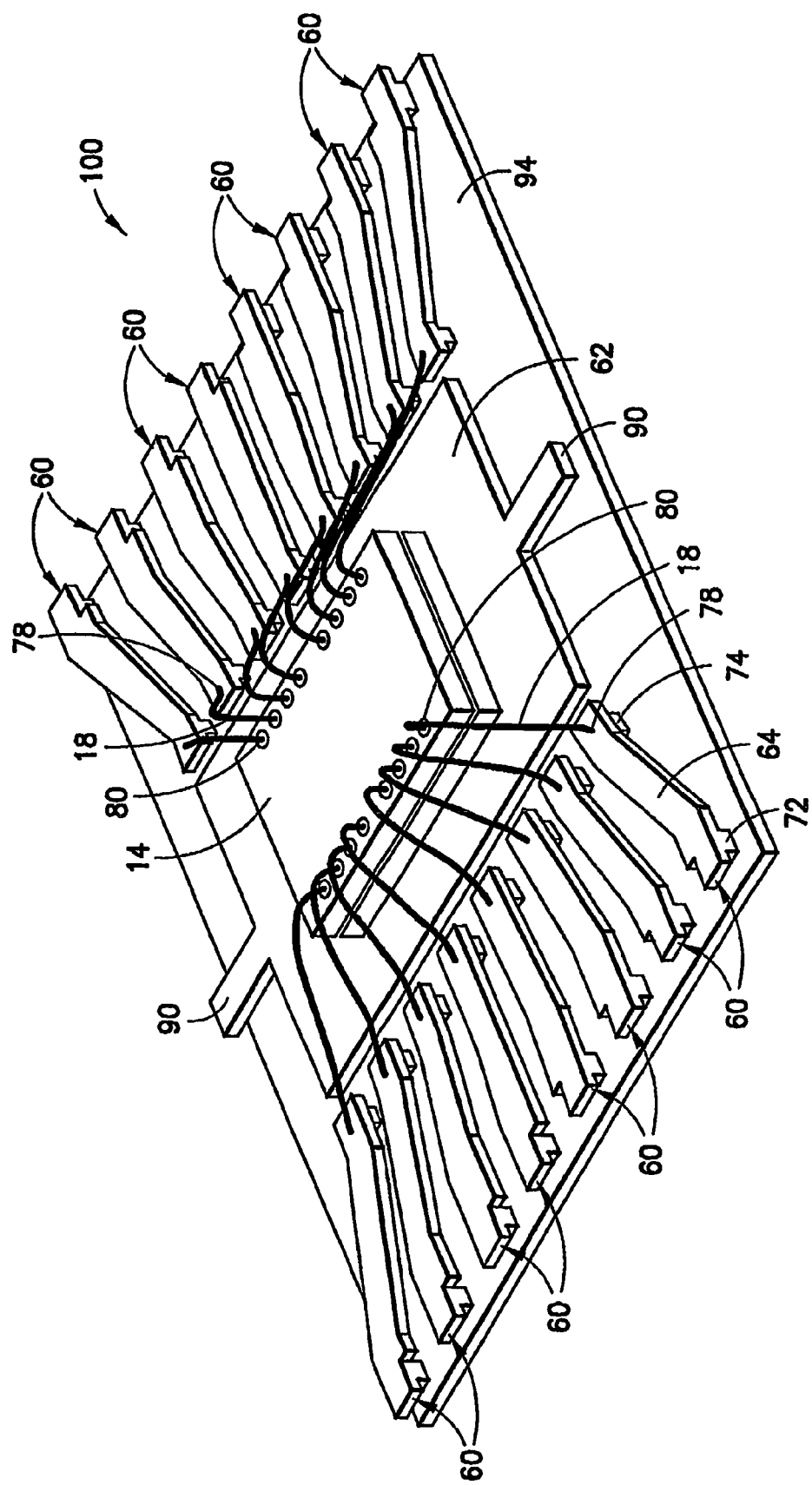
FIG. 8 is a top perspective view of a lead frame wirebonded to a die for a dual, no-lead, wirebonded semiconductor device package in accordance with another embodiment of the present invention.
Figure 9:
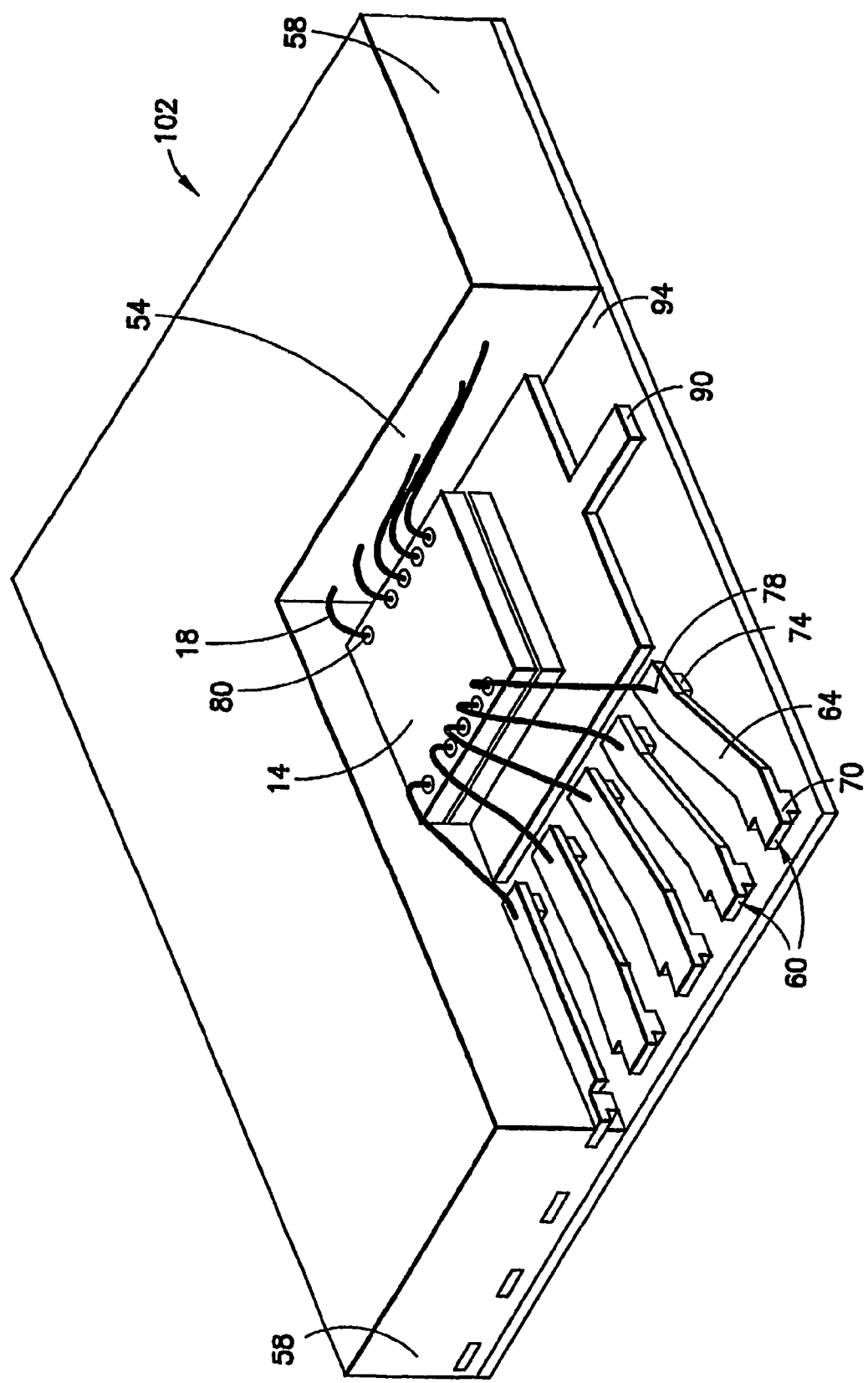
FIG. 9 is a partial cut-away, top perspective view of a semiconductor device package employing the lead frame of FIG. 8.
Figure 10:
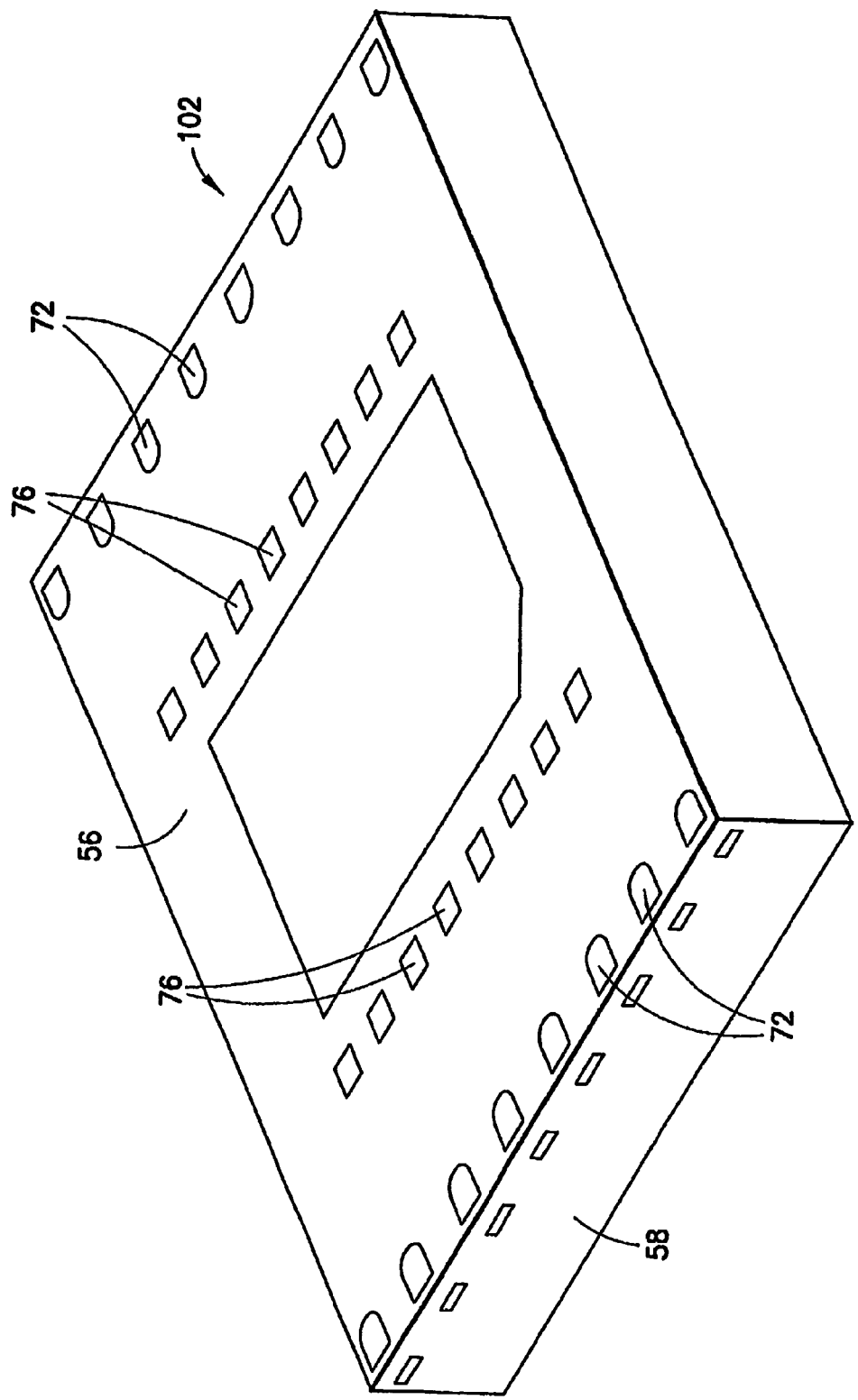
FIG. 10 is a bottom perspective view of the semiconductor device package of FIG. 9.

Referring to FIG. 8, a top perspective view of an alternative lead frame 100 wirebonded to a die 14 is shown. The lead frame 100 shown in FIG. 8 is used to produce a dual, no-lead, wirebonded semiconductor device package 102, which is shown in FIGS. 9 and 10. FIG. 9 shows a partial cut-away, top perspective view of the semiconductor package 102, and FIG. 10 shows a bottom perspective view of the semiconductor package 102. The package 102 of FIGS. 8 through 10 is substantially similar to the package 50 described with reference to FIGS. 3-7, with the exception being that the lead frame 100 is designed for a dual type semiconductor package. The lead frame 100 includes two sets of eight leads 60, with each set of leads 60 being disposed proximate opposite sides of the die support pad 62. While two sets of eight leads 60 are shown, it will be appreciated that each set may include any number of leads 60. The die support pad 62 includes two tie bars 90, which extend from opposite ends of the die support pad 62. The method of manufacturing the semiconductor package 102 is the same as that described with reference to FIGS. 3-7.

Figure 11:
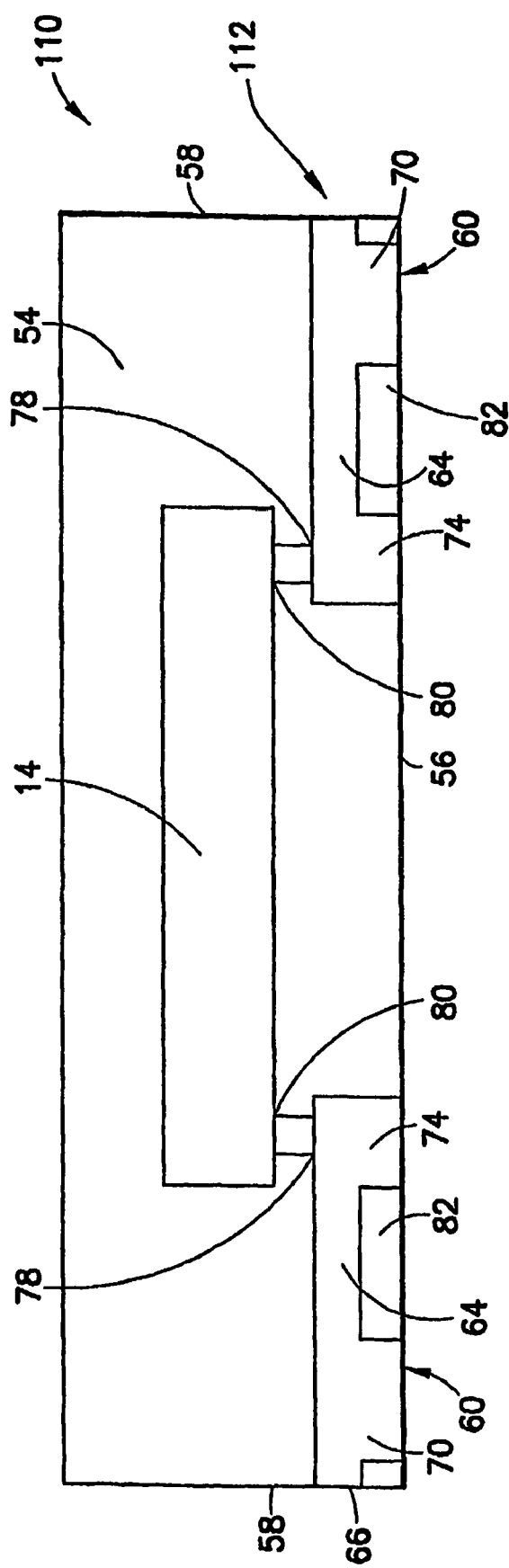
FIG. 11 is a cross-sectional view of a quad, no-lead, flip-chip semiconductor device package in accordance with another embodiment of the present invention.

Referring to FIG. 11 a cross-sectional view of a quad, no-lead, flip-chip semiconductor device package 110 is shown. The package 110 of FIG. 11 is substantially similar to the package 50 shown in FIG. 3, with the exception being that the die 14 in FIG. 11 is connected to the lead frame 112 using a flip-chip method and, as a result, no die support pad is used.

Figure 12:
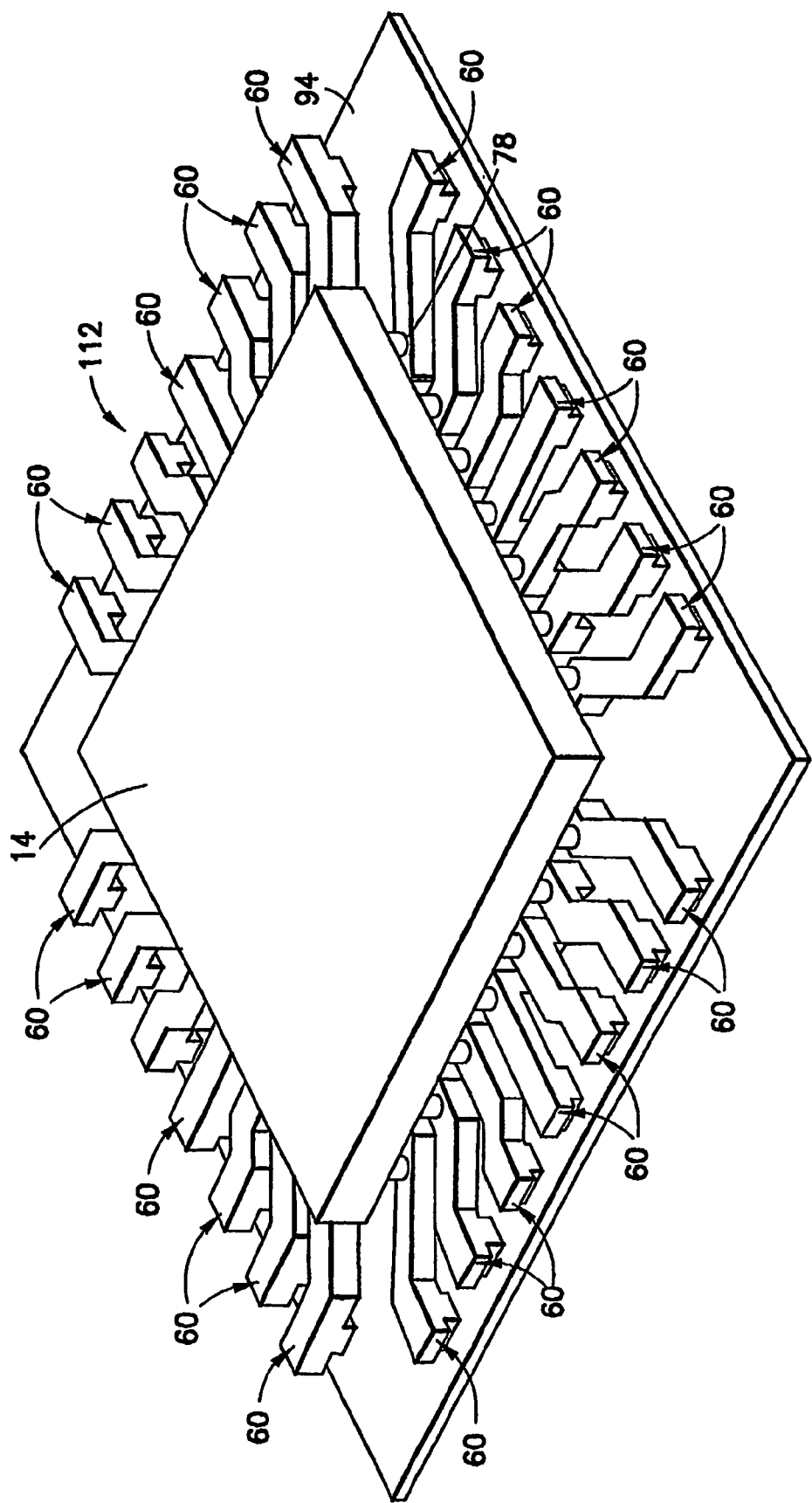
FIG. 12 is a top perspective view of a lead frame of the semiconductor device package of FIG. 11.

FIG. 12 is a top perspective view of the lead frame 112 for the quad, no-lead, flip-chip package 110 with a die 14 bonded thereto. The lead frame 112 is shown to include seven leads 60 disposed on each of four sides. It will be appreciated, however, that any number of leads 60 may be used on each site.

The method of manufacturing the package 110 is substantially similar to that described with reference to FIGS. 3-7, with the exception being that the die 14 is directly electrically connected to the bond sites 78, as shown in FIGS. 11 and 12, rather than being attached to a support pad and wirebonded or tape bonded to the bond sites 78. By "directly" electrically connected it is meant that the interconnection is by a flip-chip method without the use of an intervening wire bond or tape automated bonding tape. Suitable attachments include solders with a primary constituent selected from the group consisting of gold, tin, and lead. The support posts 74 maintain coplanarity of the bond sites 78 in each of the leads 60, allowing precise bonding of the die 14 to the bond sites 78 and, therefore, reducing defects in the manufacture of the package 110. The support posts 74 also transmit to the surface 94 any force associated with the bonding of the die 14 to the bond site 78. In addition, the support posts 74 and board connecting posts 70, which are adhered to the surface 94, prevent movement of the interposer 64 during application of the molding compound 54 and, therefore, maintain the spacing between the leads 60 and help to ensure that the bond between the die 14 and the lead frame 112 is not disturbed or broken. In addition, the channels 82 formed beneath the interposers 64 accept the molding compound 54, which anchors the interposers 64, support posts 74, and board connecting posts 70 within the package 110.

Referring to FIG. 13, a top perspective view of an alternative lead frame 120 for a dual, no-lead, flip-chip semiconductor device package is shown. In FIG. 13, a portion of adjacent lead frames 120 are shown prior to singulation, with outer frame portions 122 connecting each lead frame 120. Lines 124 indicate the portion of the lead frame 120 destroyed during singulation. It will be appreciated that any of the embodiments described herein may include such outer lead frame portions 122 for interconnecting lead frames prior to singulation. The lead frame 120 shown in FIG. 13 may be used in conjunction with the method described herein to produce a dual, no-lead, flip-chip semiconductor device package. It is contemplated that the same design of lead frame may be used for both flip-chip and wire bonded packages, with the lead frame 120 for the flip-chip package being modified only by removing the die support pad 62 from the lead frame 100 described with reference to FIGS. 8-10.

In each of the embodiments of FIGS. 3-13, the board connecting post 74 is offset from the end 66 of the interposer 64 such that the end 66 acts as a tab for anchoring the lead 60 within the molding compound 54. FIGS. 14 and 15 show alternative configurations of lead 60, where a side 124 of the board connecting post 64 adjacent to the free end 72 is visible at the face 58 of the package. This arrangement is advantageous because the side 124 will be visible on the side face 58 of the package to ensure proper alignment and connection of the board connecting posts 70 with leads mounted on a printed circuit board when the package is surface mounted to the printed circuit board. The interposer 64 may be shaped to include a recess 126 using a controlled subtractive process such as chemical etching or laser ablation. As shown in FIGS. 15a and 15b, a corner of the board connecting post 70 between the free end 72 and the side 124 may be removed to form a relief 128. Preferably, the relief 128 is between about 1 mil to about 2 mils in height when measured perpendicular to the free end 72. The relief 128 is provided to forgive or smear burr formation during the singulation process, while enabling side 124 to provide a visible fillet to facilitate surface mounting of the package.

Figure 14A:
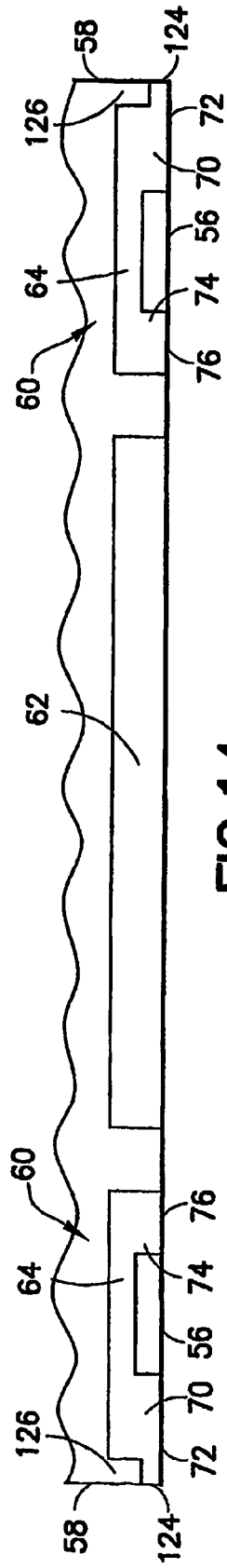
FIGS. 14a and 14b are cross-sectional views of an alternative lead configuration.
Figure 14B:
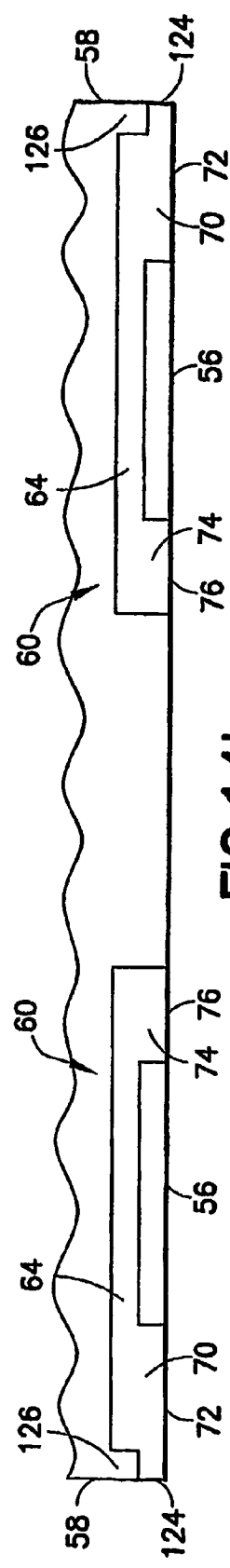
Figure 15A:
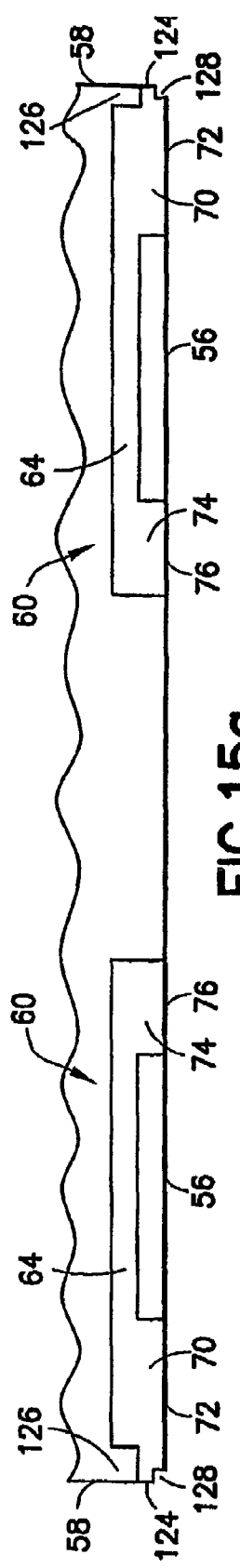
FIGS. 15a and 15b are cross-sectional views of another alternative lead configuration.
Figure 15B:
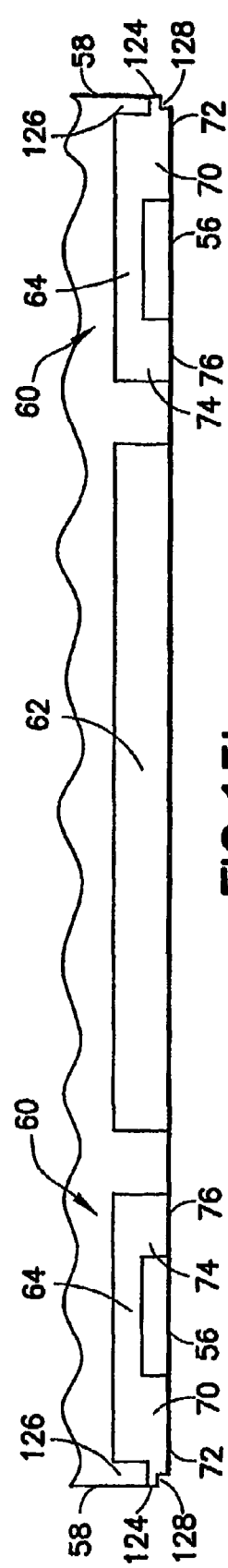
Figure 16:
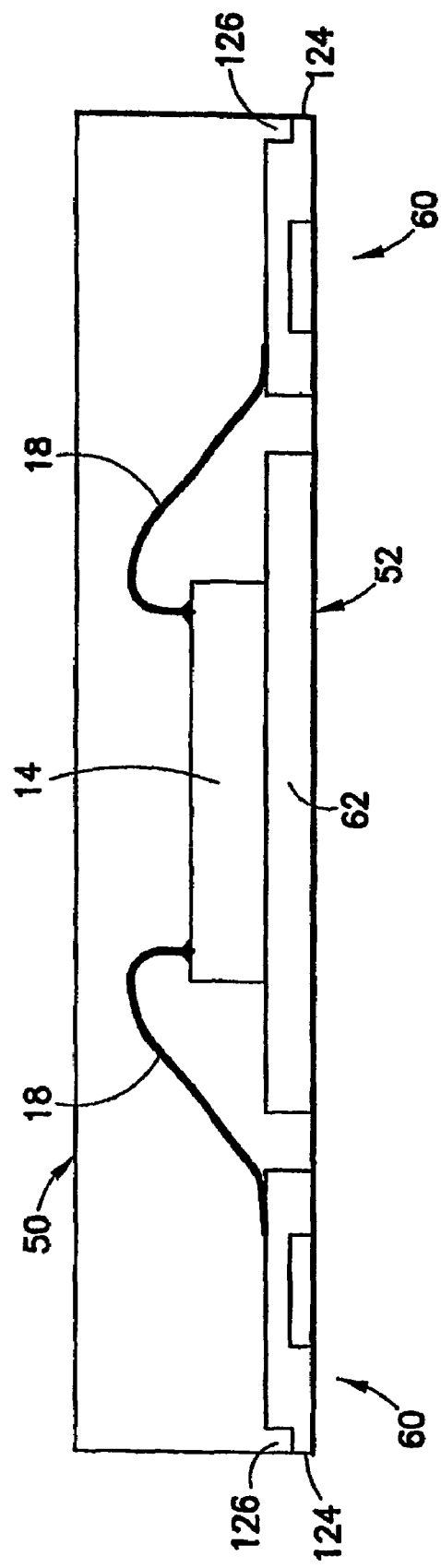
Figure 17:
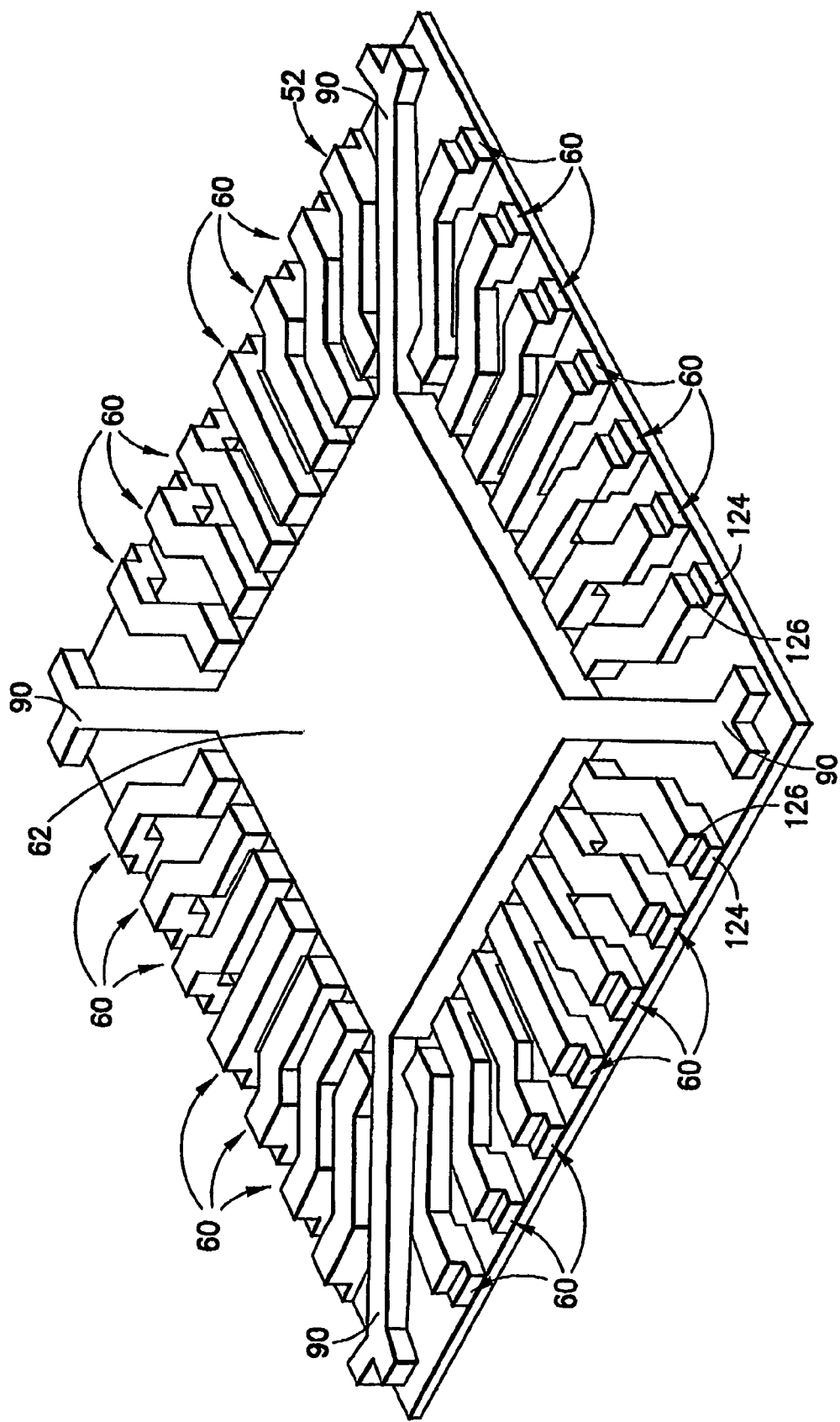
FIG. 17 is a top perspective view of a lead frame of the semiconductor device package of FIG. 16.
Figure 18:
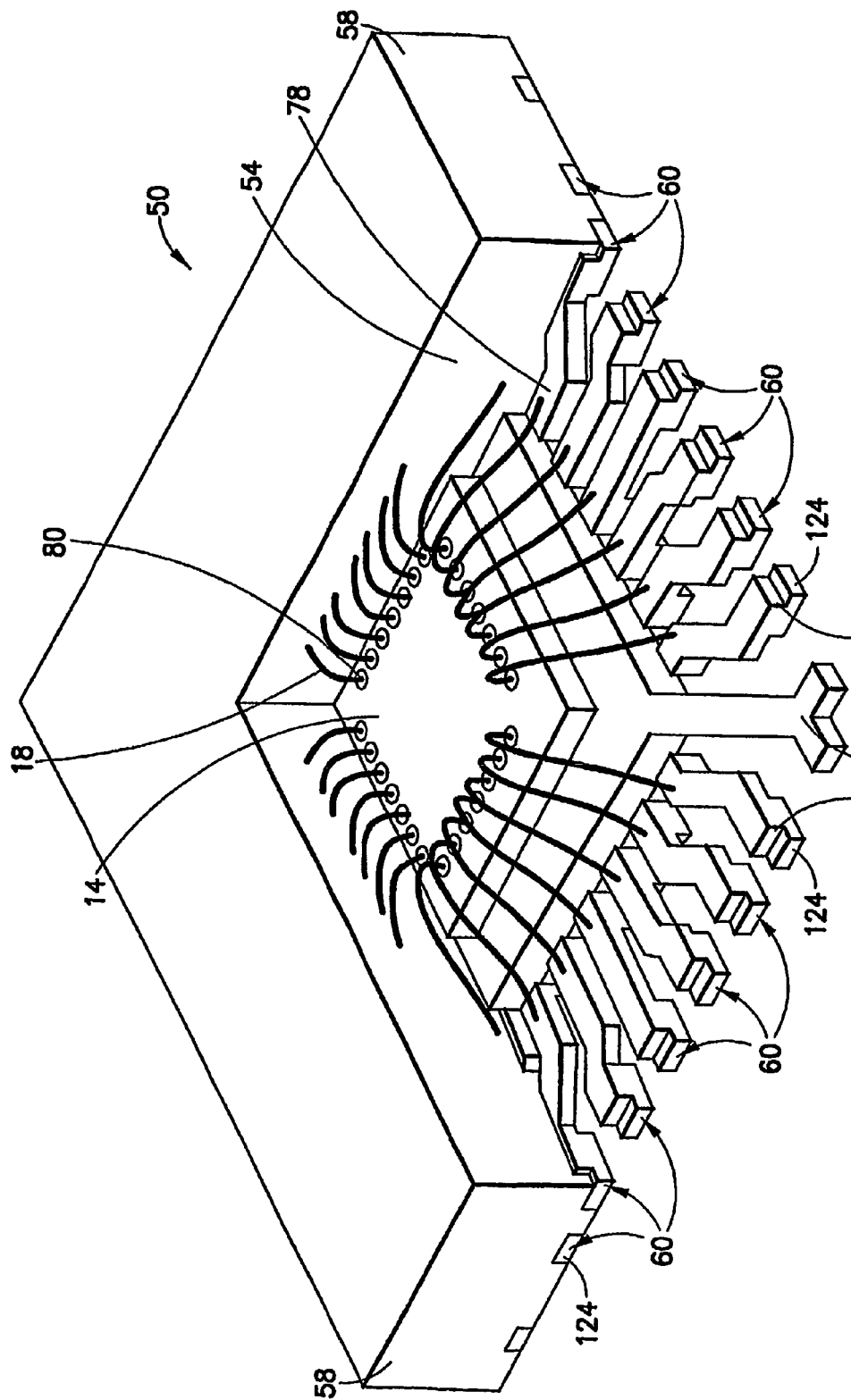
FIG. 18 is a partial cut-away, top perspective view of the semiconductor device package of FIG. 16.
Figure 19:
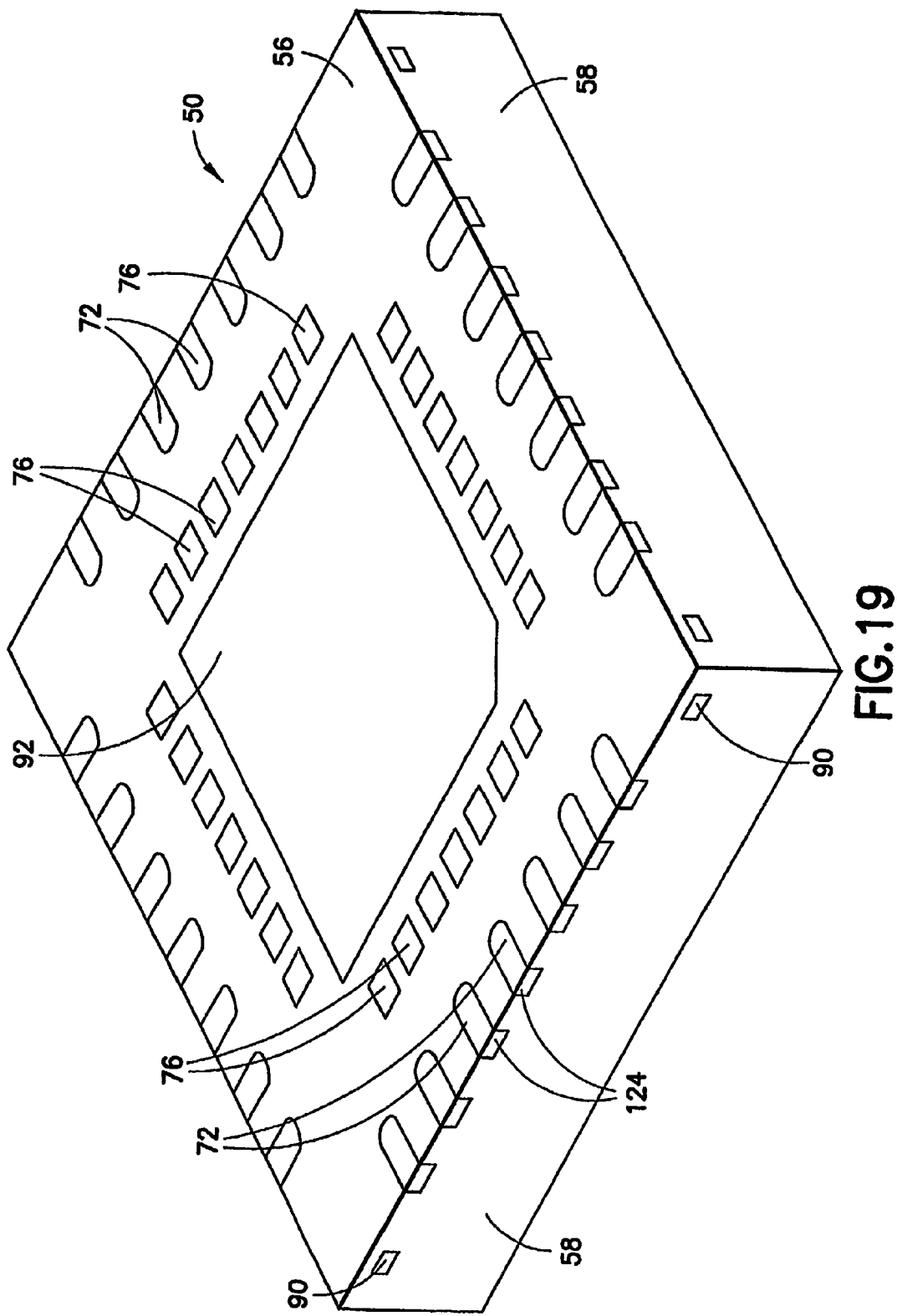
FIG. 19 is a bottom perspective view of the semiconductor device package of FIG. 16.
Figure 20:
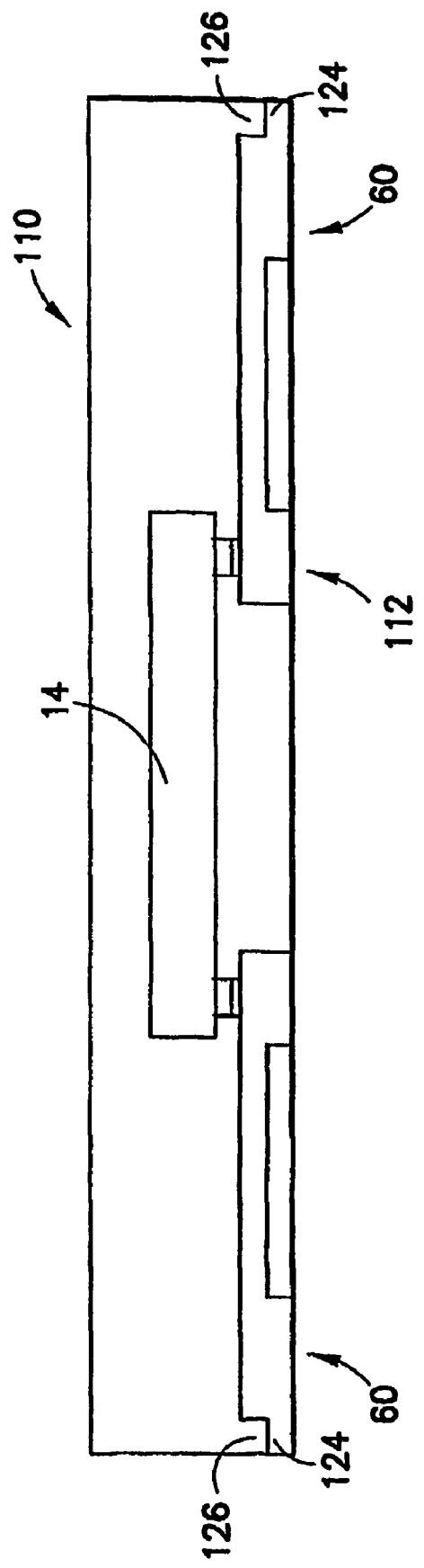
FIG. 20 is a cross-sectional view of a flip-chip semiconductor device package employing the alternative lead configuration of FIG. 14b.
Figure 21:
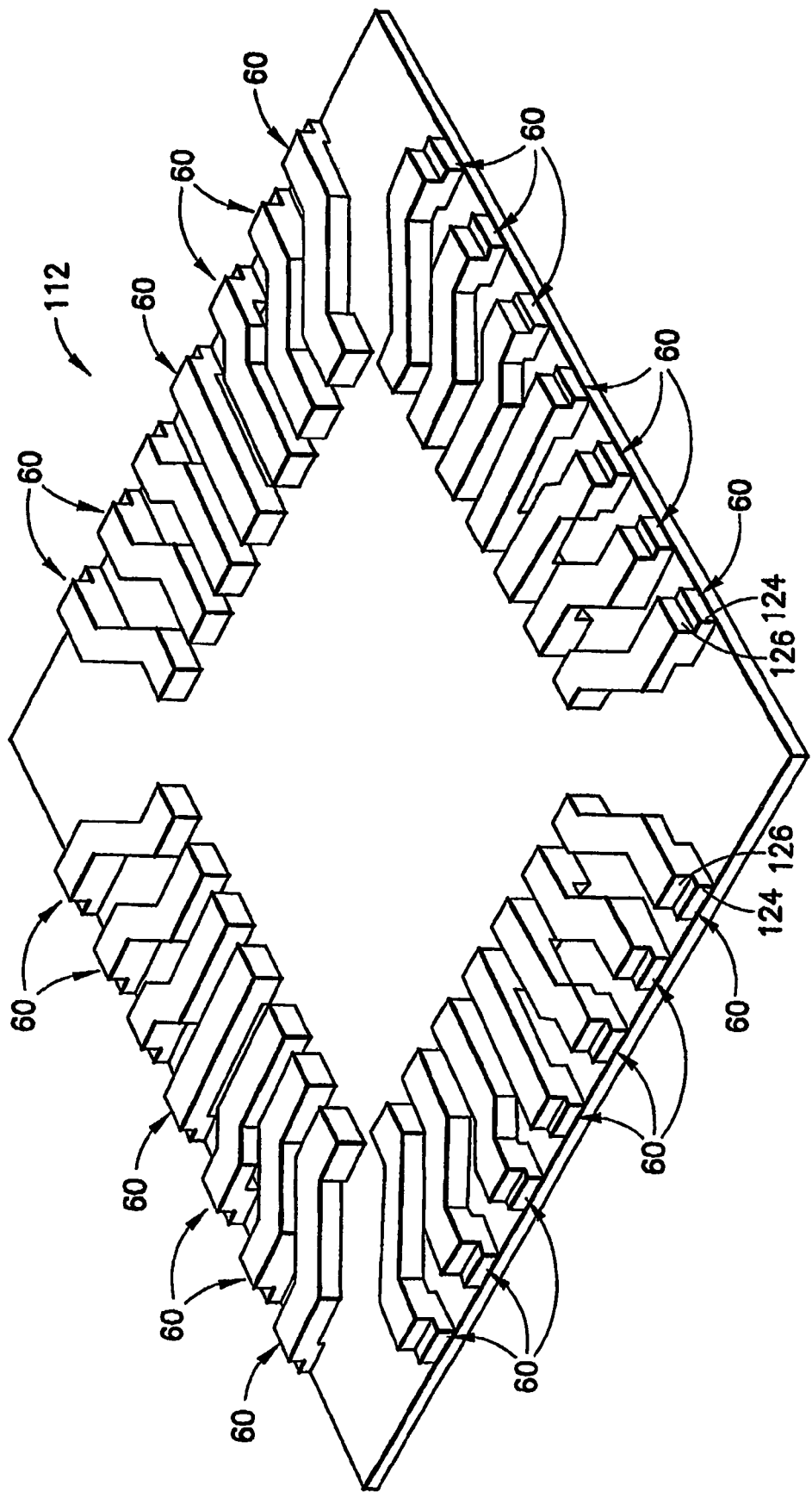
FIG. 21 is a top perspective view of a lead frame of the semiconductor device package of FIG. 20.
Figure 22:
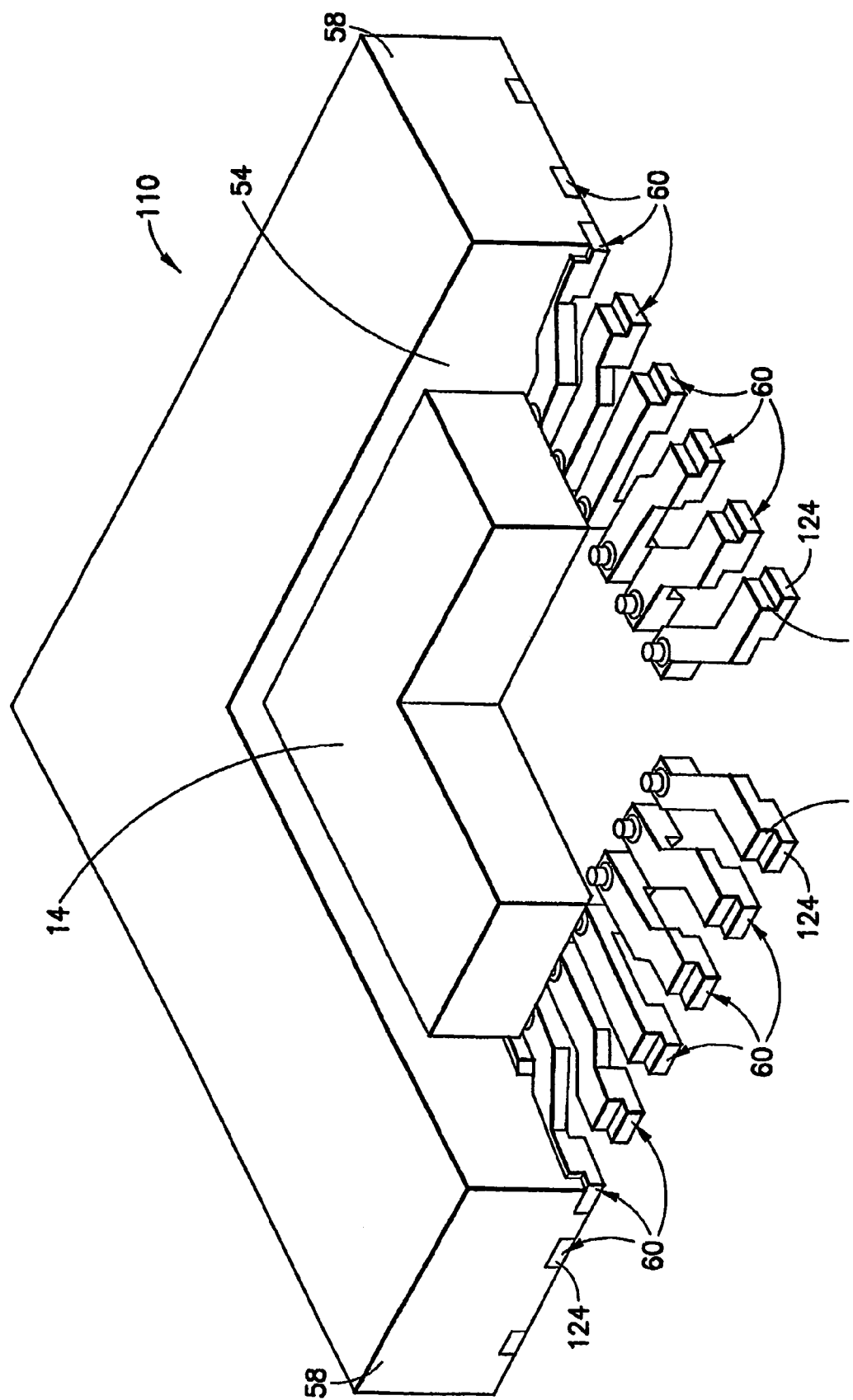
FIG. 22 is a partial cut-away, top perspective view of the semiconductor device package of FIG. 20.
Figure 23:
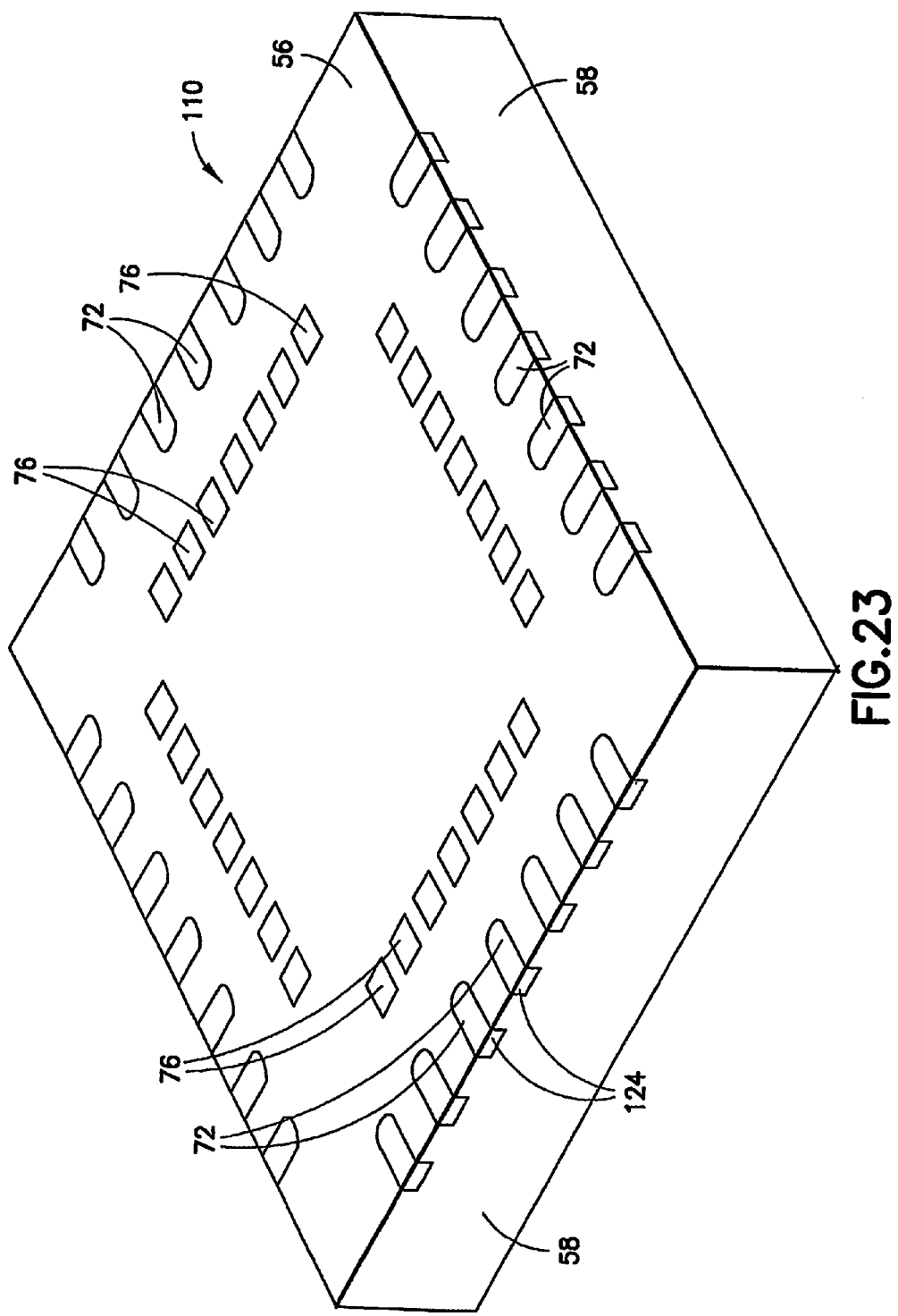
FIG. 23 is a bottom perspective view of the semiconductor device package of FIG. 20.

It will be appreciated that the alternative lead 60 arrangements shown in FIGS. 14 and 15 may be employed in any of the embodiments described herein. For example, FIG. 16 is a cross-sectional view of the quad, no-lead, wirebonded semiconductor device package 50 employing the alternative lead 60 configuration shown in FIG. 14a. FIG. 17 is a top perspective view of the lead frame 52 of package 50 employing the alternative lead 60 configuration of FIG. 14a. FIG. 18 is a partial cut-away, top perspective view of the package 50 employing the alternative lead 60 configuration of FIG. 14a, and FIG. 19 is a bottom perspective view of the package 50 employing the alternative lead 60 configuration of FIG. 14a. In another example, FIG. 16 is a cross-sectional view of the quad, no-lead, flip-chip semiconductor device package 110 employing the alternative lead 60 configuration shown in FIG. 14b. FIG. 17 is a top perspective view of the lead frame 112 of package 110 employing the alternative lead 60 configuration of FIG. 14b. FIG. 18 is a partial cut-away, top perspective view of the package 110 employing the alternative lead 60 configuration of FIG. 14b, and FIG. 19 is a bottom perspective view of the package 110 employing the alternative lead 60 configuration of FIG. 14b.

Figure 24:
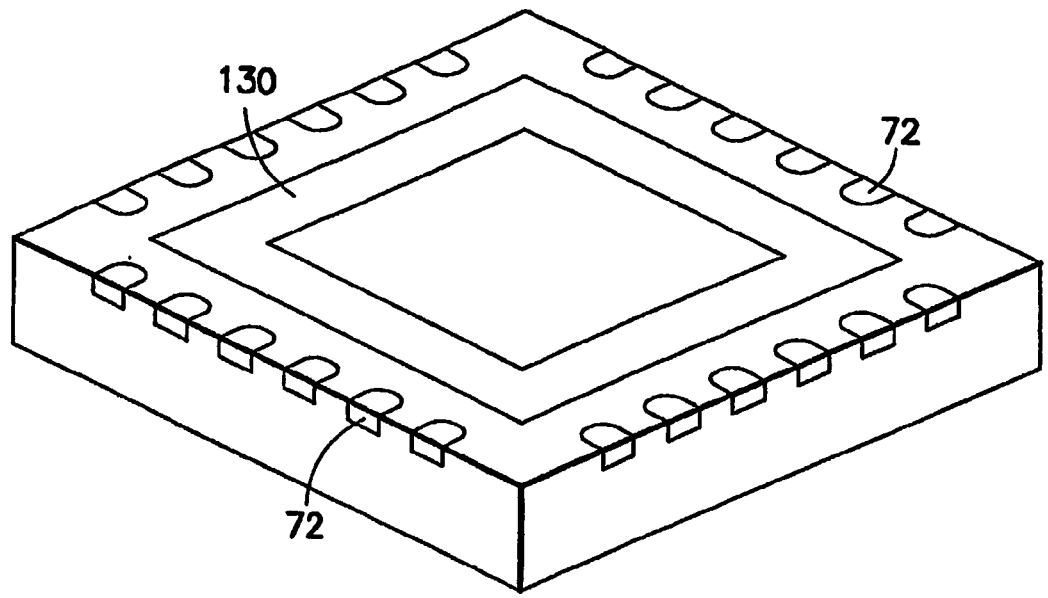
FIG. 24 is a bottom perspective view of a quad, no-lead semiconductor device package depicting an electrically insulative coating covering the free ends of the support posts.
Figure 25:
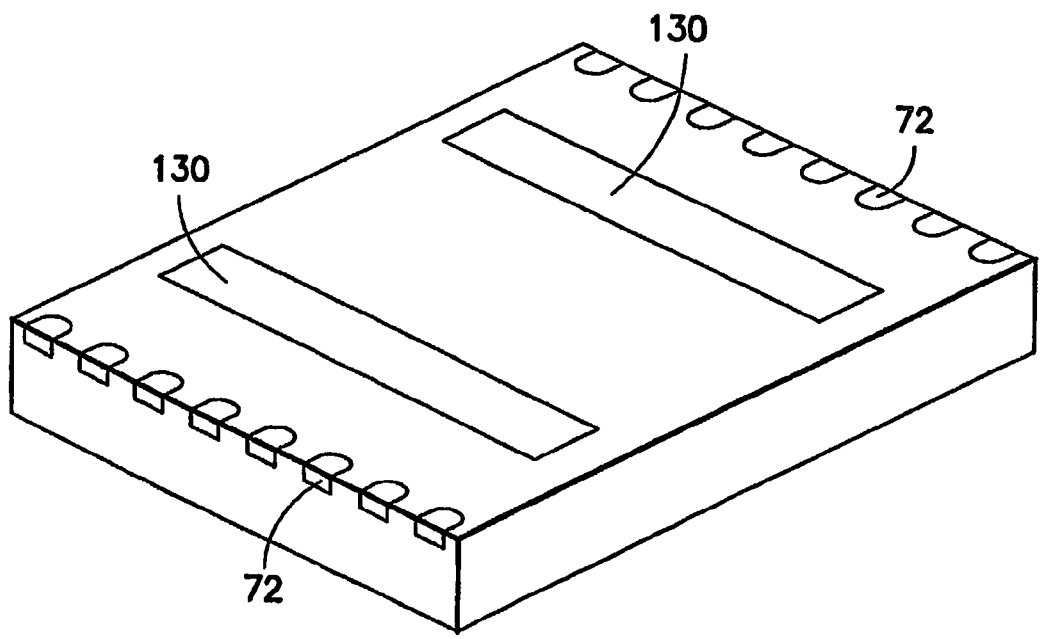
FIG. 25 is a bottom perspective view of a dual, no-lead semiconductor device package depicting an electrically insulative coating covering the free ends of the support posts.

In any of the embodiments described herein, it may be desirable to electrically isolate the free ends 76 of the support posts 74 at the bottom surface 56 of the package. This may be accomplished by applying an electrically insulative coating to the free ends 76. FIG. 24 depicts a bottom perspective view of a quad, no-lead semiconductor device package having an electrically insulative coating 130 covering the free ends 76 of the support posts 74. FIG. 25 depicts a bottom perspective view of a dual, no-lead semiconductor device package having electrically insulative coating 130 covering the free ends 76 of the support posts 74. The electrically insulative coating 130 may be applied by screen printing, inking, or taping.

Figure 26E:
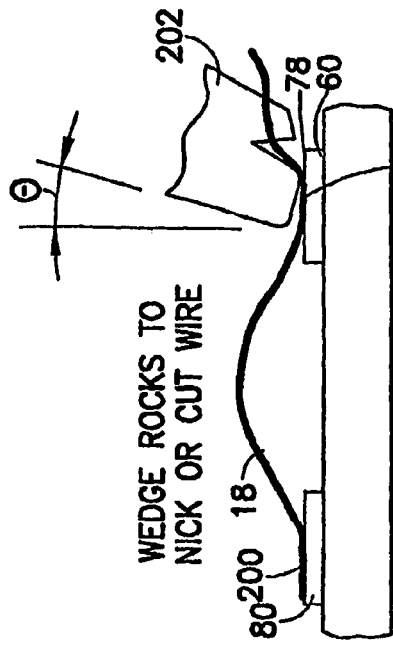
Figure 26F:
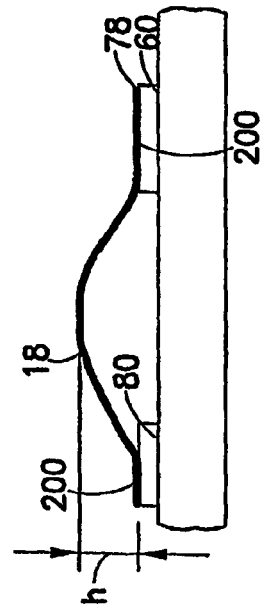
Figure 26G:
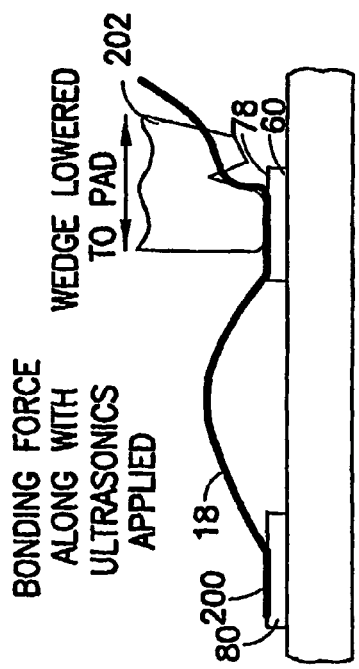
Figure 26H:
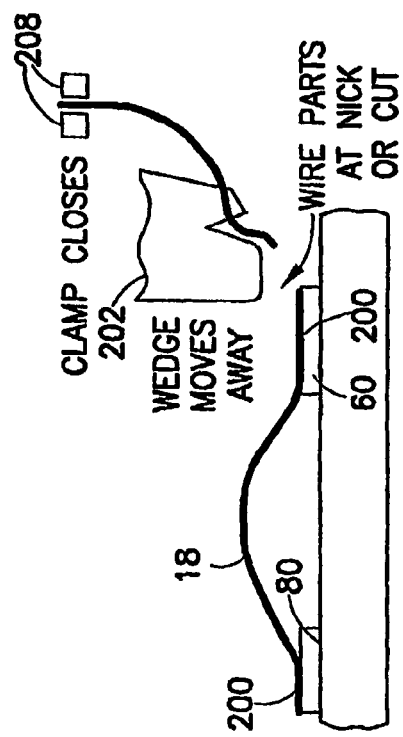

FIG. 26a-h depict various stages in a method of wedge bonding for use in wirebonding the I/O pads 80 to respective bond sites 78 on the leads 60 in the device package 50 or 102 above. The method forms what is referred to as a "wedge bond" 200 at both the I/O pad 80 and bond site 70. A wedge bond 200 is a bond in which a side surface of the wire 18 is attached to the I/O pad 80 or bond site 70, with the wire 18 extending generally parallel to the surface of the I/O pad 80 or bond site 70, as shown in FIG. 26h.

As shown in FIG. 26a, the method employs a bonding wedge (stylus) 202, which is substantially a polyhedron structure having a planar bonding face 204 formed on a free end. Disposed adjacent the bonding face 204 is a V-shaped notch, which defines a wire guide portion 206 of the bonding wedge 202. The wire guide portion 206 includes an aperture disposed therethrough for receiving the wire 18 used in the process. The bonding wedge 202 also includes a wire clamp 208 through which the wire 18 passes. The bonding wedge 202 may be manipulated by a computer-controlled system, which moves the bonding wedge 202 relative to the matrix to align the bonding wedge 202 along the axis between an I/O pad 80 and its associated bond site 78. It will be appreciated that more than one bonding wedge 202 may operate at the same time to perform the wirebonding of each frame in a matrix of frames.

The wire 18 used in the wedge bonding method may be aluminum wire or an aluminum base alloy. By aluminum-base alloy it is meant that the material contains more than 50%, by weight, of aluminum. For example, the aluminum wire may be doped with silicon (e.g., 1% silicon) to more closely match the hardness of the wire with the I/O pad 80 or bond site 78 material. Other wire materials (e.g., gold or gold base alloys) may be used.

In the wedge bonding process, the bond wire 18 is guided to the surface of the I/O pad 80 or bond site 78, then pressed onto the surface by the bonding wedge 202 as shown in FIG. 26b and FIG. 26e. While the wire 18 is firmly clamped between the bonding wedge 202 and I/O pad 80 or bond site 78, a burst of ultrasonic vibrations is applied to the bonding wedge 202. If the ultrasonic vibrations are performed at ambient temperature (i.e., without an external heat source applied to the bonding wedge 202, bond wire 13, I/O pad 80, or bond site 78), the process is referred to as an ultrasonic bonding. With ultrasonic bonding the combination of the pressure and the vibration accomplishes a metallurgical cold weld between the wire 13 and the I/O pad 80 or bond site 78. Where heat is applied to the bonding wedge 202, bond wire 18, I/O pad 80 or bond site 78 while the burst of ultrasonic vibrations is applied to the bonding wedge 202, the process is referred to as thermosonic bonding. However, unlike conventional thermosonic bonding, a wedge bond 200 is formed at both the I/O pad 80 and bond site 78.

In FIGS. 26b-26g, the wedge bonding method is described wherein the wire 18 is bonded to the I/O pad 80 before being bonded to the bond site 78 on the lead 60. Alternatively, the wire 18 may be bonded to the bond site 78 before being bonded to the I/O pad 80.

Referring to FIG. 26b, the wire 18 is wedge bonded to the I/O pad 80 using ultrasonic or thermosonic bonding. After the wedge bond 200 is formed at the I/O pad 80, the clamp 208 releases the wire 18 and the bonding wedge 202 moves away from the I/O pad 80 toward the associated bond site 78 on the lead 60, as shown in FIGS. 26c and 26d. The bonding wedge 202 is then lowered onto the bond site 78, and the wire 18 is wedge bonded to the bond site 78 using ultrasonic or thermosonic bonding. After the wedge bond 200 between the wire 18 and the bond site 78 is formed, the bonding wedge 202 rocks to nick or cut the wire 18 (FIG. 26f), and the bonding wedge 202 moves away from the lead 60 with the clamp 208 closed to part the wire 18 (FIG. 26g). The result is a wedge bond 200 formed between the wire 18 and the I/O pad 80 and between the wire 18 and the lead 60, as shown in FIG. 26h.

Figure 27:
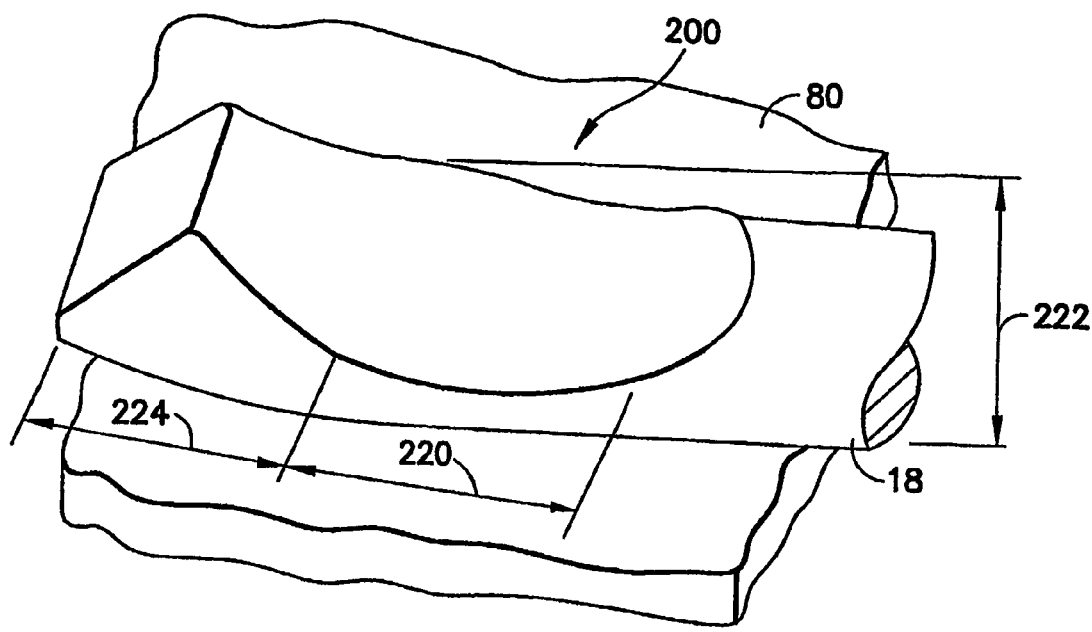
FIG. 27 is a perspective view of a wedge bond on an I/O pad of a chip.
Figure 28:
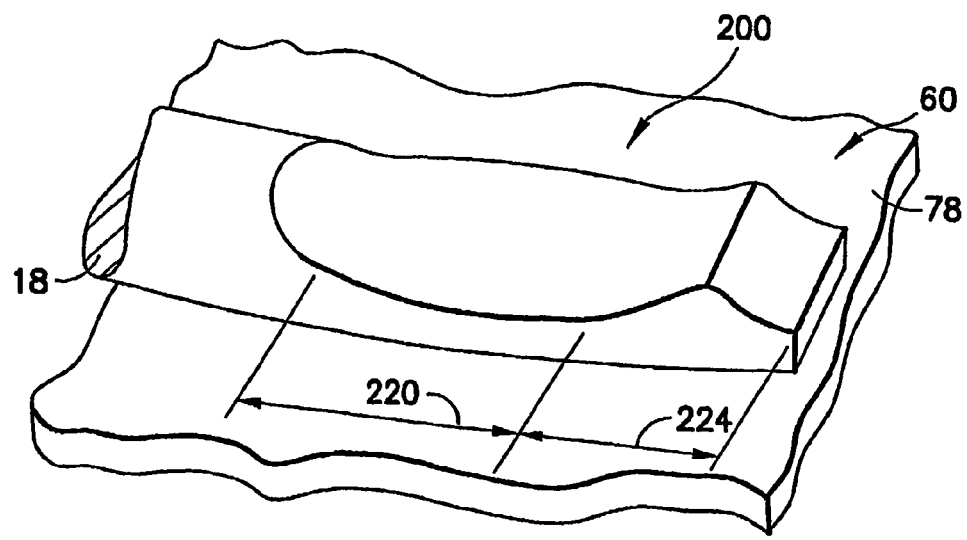
FIG. 28 is a perspective view of a wedge bond on a bond site of a lead.

FIG. 27 is a perspective view of a wedge bond 200 formed on an I/O pad 80, and FIG. 28 is a perspective view of a wedge bond 200 on a bond site 78 of a lead 60. As can be seen in FIGS. 27 and 28, at the wedge bond 200, a side surface of the wire 18 is attached to the I/O pad 80 or bond site 78, with the wire 18 extending generally parallel to the surface of the I/O pad 80 or bond site 78. The wire 18 is flattened along the wedge bond 200, with the length of this flattened portion being defined as the wedge length (indicated at 220). The maximum width of the flattened portion of the wire 18 as measured transverse to the wire 18 in a direction parallel to the plane of the surface of the I/O pad 80 or bond site 78 is defined as the wedge width (indicated at 222), and the length of the free end of the wire 18 extending past the flattened portion is known as the tail length (indicated at 224). The wedge width 222 is typically between about 1.2 to about 1.5 times a diameter of an unflattened portion of the wire 18 extending between the I/O pad 80 and the bond site 78.

It has been found that the sequence of forming the wedge bond 200 on the I/O pad 80 and lead 60 determines which of the I/O pad 80 and lead 60 has the longer tail length 224. More specifically, it has been found that the point where termination of the wire occurs (the I/O pad 80 or the lead 60) has a shorter tail length 224. Accordingly, where a wedge bond 200 is first formed on the I/O pad 80 and then formed on the lead 60, as described above, the tail length 224 at the lead 60 is shorter than the tail length 224 at the I/O pad 80. Advantageously, having a shorter tail length 224 at the lead 60 helps to ensure that the tail portion of the wire 18 will not protrude past the end of the lead 60 and, as a result, the package width can be minimized.

Device packages 50 and 102 described above are particularly well-suited for the wedge bonding method because the support posts 74 in the device packages 50 and 102 provide support to the bond site 78, which prevents damage to the leads 60 during formation of the wedge bond 200. It is contemplated that the method may be used in other types of packages as well. For example, FIGS. 29a-29i depict, in various stages of assembly, an alternative semiconductor device package 300 that would also be well suited for use with the method.

In FIGS. 29a-29j, each lead frame 302 is only partially etched prior to wirebonding. The lead frame 302 is etched on its upper surface such that the support pad 62 and leads 60 remain connected by a metal substrate 304. The metal substrate 304 provides a solid structure and support for the leads 60 during the wedge bonding process, thereby preventing damage to the leads 60. In another embodiment, the lead frame may be partially etched such that, while the leads 60 are not connected to the support pad 60, they have a thickness greater than that which will be used in the resulting package. The additional thickness will provide the solid structure and support needed to prevent damage to the leads 60 during the wedge bonding process.

Figure 29A:
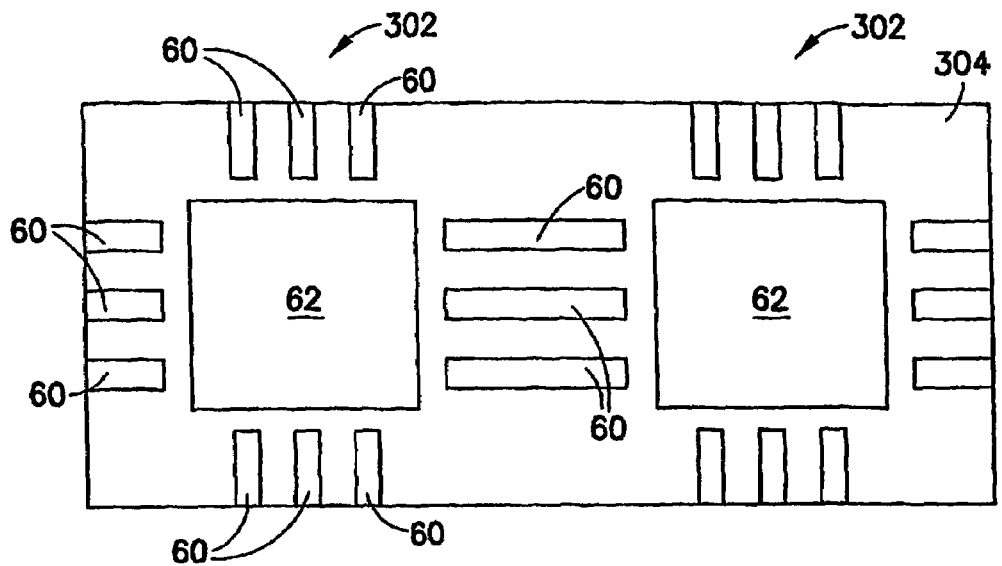
FIGS. 29a-29i depict an alternative semiconductor device package of in various stages of assembly.
Figure 29B:
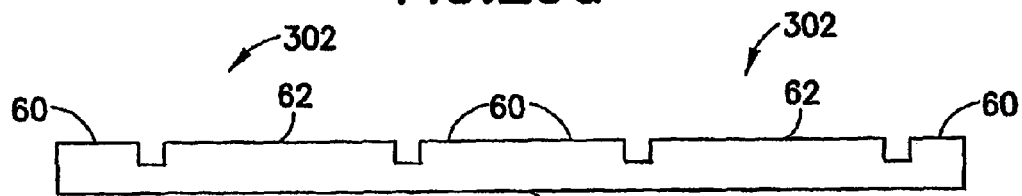

FIG. 29a is a plan view of a precursor stage of the lead frame 302 (FIG. 29g), and FIG. 29b is a cross-sectional elevation view of the precursor stage of the lead frame 302. A plurality of lead frames 302 are preferably connected to allow for simultaneous assembly. It is contemplated that, alternatively, the lead frames 302 may be assembled individually.

The lead frame 302 may be formed from a sheet of any suitable conductor and is preferably copper or a copper base alloy.

The various features formed in each of lead frame 302 are preferably formed using a controlled subtractive process such as chemical etching or laser ablation. For example, each surface intended to form the upper surfaces of the leads 60 and support pad 62 may be coated with a chemical resist and the remaining surface exposed to a suitable etchant for a time effective to reduce the thickness beneath the remaining surface such that the desired height of the leads 60 and support pad 62 is achieved. This process results in leads 60 and support pad 62, all of which extend from the substrate 304.

Figure 29C:
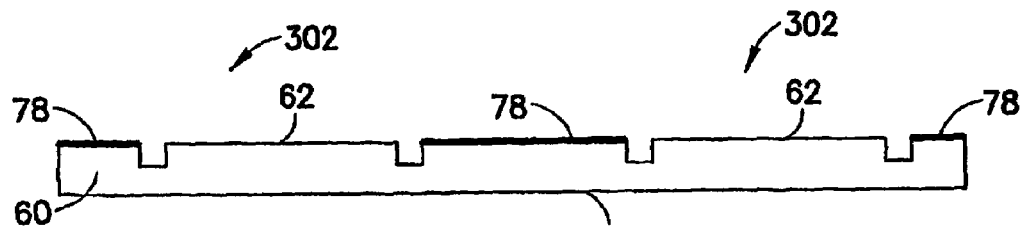

Referring to FIG. 29c, the bond sites 78 on the leads 60 may be plated with a material to facilitate wire bonding. For example, the bond sites 78 may be plated with a material corresponding to the material used in the wire 18 (e.g., the bond sites 78 may be plated with aluminum or aluminum base alloy where aluminum or aluminum base alloy wire 18 is used).

Figure 29D:
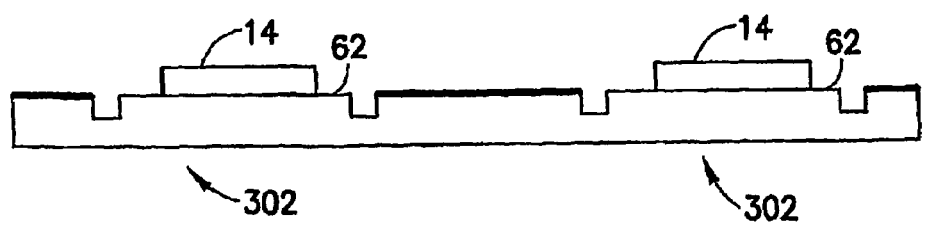
Figure 29E:
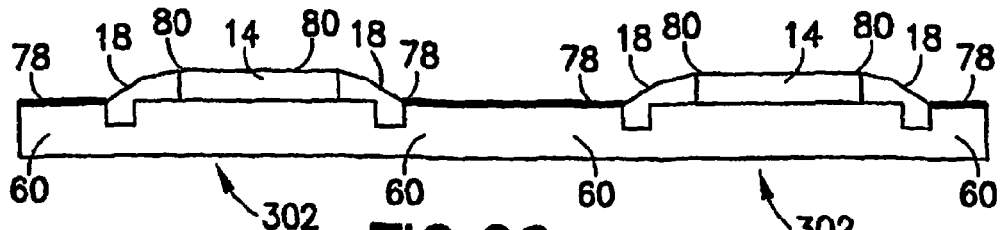

Referring to FIG. 29d, the die 14 is next secured to the support pad 62 using any convenient method, such as solder, epoxy, double-sided adhesive tape, and the like. After the die 14 is secured to the support pad 62, wires 18 are individually connected between I/O pads 80 on the die 14 and the bond sites 78 on the respective leads 60, as shown in FIG. 29e.

Figure 29F:
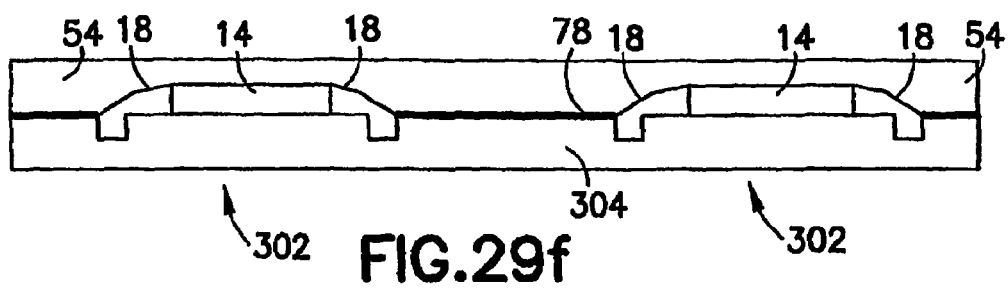

Referring to FIG. 29f, after the wire bonding is completed, the die 14, upper portion of lead frame 302, and bond wires 18 are covered with the molding compound 54. The molding compound 54 may be applied using any convenient technique, such as a transfer or injection molding process. The molding compound 54 is an electrically insulative material, preferably a polymer molding resin, such as an epoxy, having a flow temperature in the range of between about 250° C. to about 300° C. The molding compound 54 may also be a low temperature thermal glass composite.

Figure 29G:
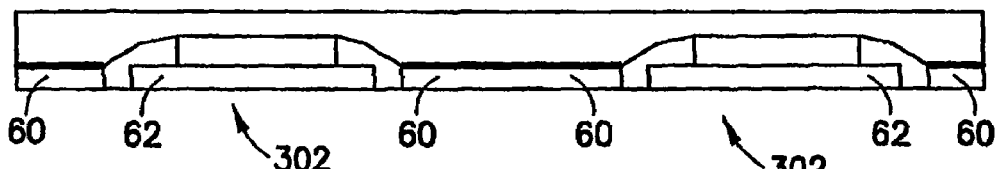
Figure 29H:
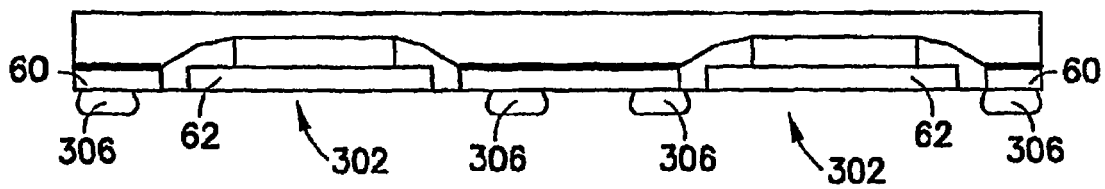

After the molding compound 54 is applied, the substrate 304 material is removed using a controlled subtractive process such as chemical etching or laser ablation. The result of this step is shown in FIG. 29g. Removal of the substrate 304 material electrically separates the leads 60 from the support pad 60. The exposed surfaces may be plated to facilitate electrical connection to an external circuit. Also, solder balls 306 may be attached to the exposed surfaces to facilitate electrical connection with an external circuit, as shown in FIG. 29h.

Figure 29I:
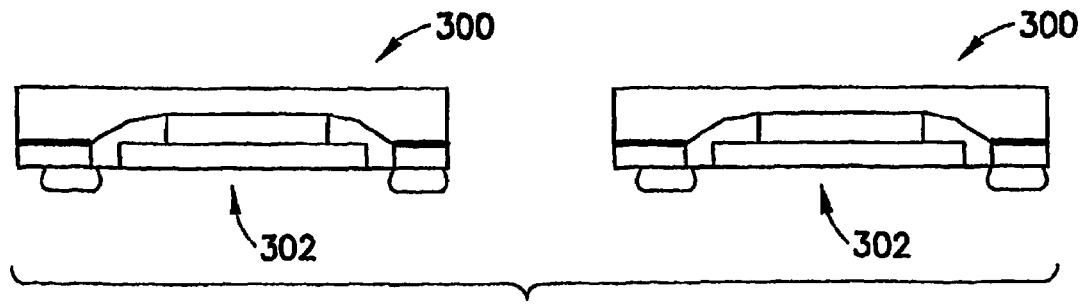

The attached packages are then singulated by sawing with a blade, water jet, or the like, to form the packages 300 as shown in FIG. 29i.

Using the method of wedge bonding to wirebond the I/O pads 80 to respective bond sites 78 on the leads 60 provides many advantages over prior art techniques. For example, the resulting wedge width 222 (FIG. 27) is about 1.2-1.5 times the wire 18 diameter used, which is significantly less than the width of a ball bond, which is typically 2-3 times the wire 18 diameter. The smaller width allows for a reduction in lead pitch (i.e., spacing between adjacent leads) as compared to ball bonding. As a result, use of the wedge bonding method can permit a significant increase in the number of leads 60 used in a package over that possible with ball bonding.

Figure 1:
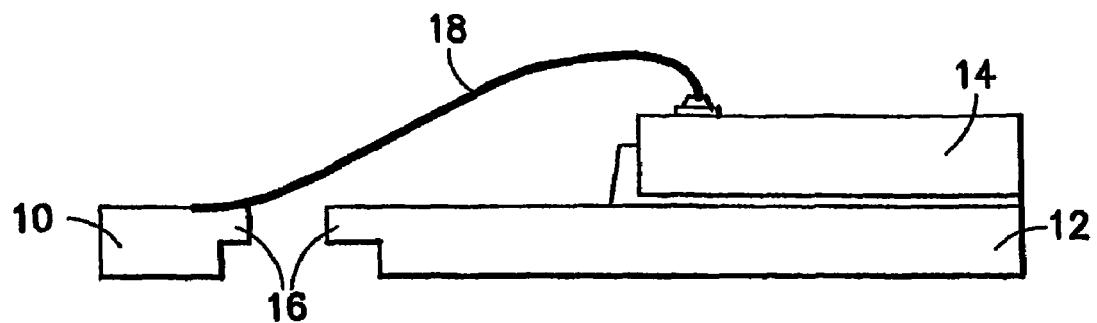
FIG. 1 is a cross-sectional view of a portion of a wirebonded, no-lead package of the prior art.
Figure 2:
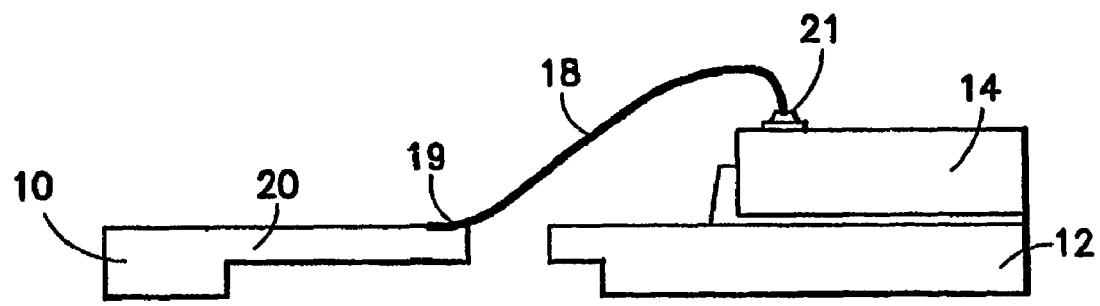
FIG. 2 is a cross-sectional view of a portion of another wirebonded, no-lead package of the prior art.

In addition, the method of wedge bonding allows for a smaller wire loop height compared to that possible with ball bonding characteristics. As can be seen in FIG. 26h, the wire loop height is the height "h" that the wire 18 extends above the contact sites (e.g., I/O pad 80). Because the wire extends generally parallel to the contact sites, the loop height "h" can be relatively small compared to the loop height required for ball bonding, in which the wire extends perpendicularly from the contact site, as shown at 21 in FIG. 2. This is a significant advantage in attaining thinner plastic packages and stacked, multiple die packages.

Furthermore, the method of wedge bonding can be performed using ultrasonic bonding at room temperature and, therefore, enhance reliability of the packaging process over that possible with ball bonding methods. More specifically, ball bonding requires exposing the lead frames and dice to temperatures around 150-360 degrees Centigrade. With the large number of wirebonds being used today in matrix and array-matrix formats, the time to perform the wirebonding, and thus the time the components are subjected to high temperatures, can be great enough to cause defects in the dice 14. By eliminating the need to use high temperature, the method of wedge bonding eliminates this source of defects.

Finally, the method of wedge bonding can reduce the cost to manufacture a package because the method allows the used of aluminum or aluminum base alloy wire, which costs far less than the gold wire typically used for ball bonding techniques.

A number of embodiments of the present invention have been described. Nevertheless, it will be understood that various modifications may be made without departing from the spirit and scope of the invention. Accordingly, other embodiments are within the scope of the following claims.

It should be understood that any of the features, characteristics, alternatives, modifications, or advantages described regarding a particular embodiment herein may also be applied, used, or incorporated with any other embodiment described herein.

What is claimed is:

1. A semiconductor device package (50, 102, 110) comprising:
   a molding compound (54) forming at least a portion of a first package face (56);
   a semiconductor device (14) at least partially covered by the molding compound (54), the semiconductor device (14) including a plurality of I/O pads (80); and
   a lead frame (52, 100, 112) of electrically conductive material at least partially covered by the molding compound (54), the lead frame (52, 100, 112) including a plurality of leads (60), each of the leads (60) including:
      an interposer (64) having opposing first and second ends (66, 68), the interposer (64) being spaced apart from the first package face (56) by a distance,
      a board connecting post (70) extending from the interposer (64) proximate the first end (66) and terminating at the first package face (56),
      a support post (74) spaced apart from the board connecting post (70), the support post (74) extending from the interposer (64) proximate the second end (68) and terminating at the first package face (56), and
      a bond site (78) formed on a surface of the interposer (64) opposite the support post (74), at least one of the I/O pads (80) being electrically connected to the interposer (64) at the bond site (78),
   wherein
      the interposer (64) has a recess (126) formed therein adjacent the second end (66), and
      a corner between a side surface (124) of the board connecting post (70) and an end surface (72) of the board connecting post (70) is removed to form a relief (128), the relief (128) having a height less than said distance.

2. The semiconductor device package (50, 102) of claim 1, wherein the at least one of the I/O pads (80) is wire bonded or tape bonded to the bond site (78).

3. The semiconductor device package (50, 102) of claim 2, wherein the at least one of the I/O pads (80) is electrically connected to the interposer (64) at the bond site (78) by a wire forming a wedge bond at the I/O pad (80) and a wedge bond at the bond site (78).

4. The semiconductor device package (50, 102) of claim 3, wherein the wire is made from aluminum or aluminum base.

5. The semiconductor device package (110) of claim 1, wherein the at least one of the I/O pads (80) is directly soldered to the bond site (78) for forming a flip-chip type connection.

6. The semiconductor device package (50, 102, 110) of claim 2, wherein the molding compound (54) forms at least a portion of a second package face (58) adjacent to the first package face (56), and the side surface (124) of the board connecting post (70) adjacent the end surface (72) of the board connecting post (70) is visible at the second package face (58).

7. The semiconductor device package (50, 102, 110) of claim 6, wherein the relief (128) has a height of between about 1 mil to about 2 mils measured from the end surface (72) of the board connecting post (124).

8. The semiconductor device package (50, 102, 110) of claim 1, wherein each of the leads (60) is formed from a strip of material having a channel (82) disposed across the strip.

9. The semiconductor device package (50, 102, 110) of claim 8, wherein the channel (82) is filled with the molding compound (54).

10. A method of packaging a semiconductor device (14), the method comprising:
    forming a lead frame (52, 100, 112) from electrically conductive material, the lead frame (52, 100, 112) including a plurality of leads (60), each of the leads (60) including:
       an interposer (64) having opposing first and second ends (66, 68),
       a board connecting post (70) extending from the interposer (64) proximate the first end (66), the board connecting post (70) having an end surface (72) distal from the interposer (64) and extending therefrom by a distance,
       a support post (74) spaced apart from the board connecting post (70) and extending from the interposer (64) proximate the second end (68), the support post (74) having an end surface (76) distal from the interposer (64), and
       a bond site (78) formed on a surface of the interposer (70) opposite the support post (74),
       wherein the interposer (64) has a recess (126) formed therein adjacent the second end (66), and a corner between a side surface (124) of the board connecting post (70) and an end surface (72) of the board connecting post (70) is removed to form a relief (128), the relief (128) having a height less than said distance;
    supporting the end surfaces (72,76) of the support post (74) and the board connecting post (70); and
    electrically connecting I/O pads (80) on the semiconductor device (14) to the bond sites (78) while supporting the end surfaces (72, 76) of the support post (74) and the board connecting post (70); and
    covering at least a portion of the semiconductor device (14), and at least a portion of the lead frame (52, 100, 112) with a molding compound (54) while supporting the end surfaces of the support post (74) and the board connecting post (70).

11. The method of claim 10, wherein electrically connecting the I/O pads (80) to the bond sites (78) includes:
    wire bonding or tape bonding each I/O pad (80) to an associated bond site (78).

12. The method of claim 11, wherein the wire bonding each I/O pad (80) to an associated bond site (78) includes:
    wedge bonding a wire (18) to the I/O pad (80), and wedge bonding the wire (18) to the bond site (78).

13. The method of claim 12, wherein the wire (18) is made of aluminum or aluminum base.

14. The method of claim 10, wherein electrically connecting the I/O pads (80) to the bond sites (78) includes:
directly electrically connecting the I/O pads (80) to the bond sites (78) to form a flip-chip type connection.

15. The method of claim 10, wherein supporting the end surfaces (72, 76) of the support post (74) and the board connecting post (70) includes:
adhering the end surfaces (72, 76) of the support post (74) and the board connecting post (70) to a surface (94).

16. The method of claim 10, wherein the molding compound (54) forms at least a portion of a first package face (56), and the end surfaces (72, 76) of the support post (74) and the bond connecting post (70) are coplanar with the first package face (56).

17. The method of claim 16, wherein the molding compound (54) forms at least a portion of a second package face (58) adjacent to the first package face (56), and the side surface (124) of the board connecting post (70) adjacent the end surface (72) of the board connecting post (70) is visible at the second package face (58).

18. The method of claim 17, wherein the relief (128) has a height of between about 1 mil to about 2 mils measured from the end surface (72) of the board connecting post (124).

19. The method of claim 10, wherein forming the lead frame (52, 100, 112) includes:
forming a lead frame precursor from electrically conductive material, the lead frame precursor including a plurality of lead precursors, each of the lead precursors being a strip of the conductive material; and
disposing a channel (82) across each of the lead precursors to form the plurality of leads (60).

20. The method of claim 19, further comprising:
filling the channel (82) in each lead with the molding compound (54).

21. A semiconductor device package (50, 102, 300) comprising:
a molding compound (54) forming at least a portion of a first package face (56);
a semiconductor device (14) at least partially covered by the molding compound (54), the semiconductor device (14) including a plurality of I/O pads (80); and
a lead frame (52, 100, 302) of electrically conductive material at least partially covered by the molding compound (54), the lead frame (52, 100, 302) including a plurality of leads (60), wherein
each of the leads (60) includes a bond site (78) formed thereon, each bond site (78) being electrically connected to an associated I/O pad (80) by a wire (18), the wire (18) forming a wedge bond at the I/O pad (80) and a wedge bond at the bond site (78),
each of the leads has a portion spaced apart from a bottom surface (56) of the package by a distance,
each of the leads has a recess (126) formed therein adjacent a side surface (58) of the package, and
a corner between the side surface and a bottom surface (56) of the package is removed to form a relief (128), the relief (128) having a height less than said distance.

22. The semiconductor device package (50, 102, 300) of claim 21, wherein the wire (18) is made from aluminum or aluminum base.

23. The semiconductor device package (50, 102) of claim 21, wherein each of the leads (60) further includes:
an interposer (64) having opposing first and second ends (66, 68), the interposer (64) being spaced apart from the first package face (56),
a board connecting post (70) extending from the interposer (64) proximate the first end (66) and terminating at the first package face (56),
a support post (74) spaced apart from the board connecting post (70), the support post (74) extending from the interposer (64) proximate the second end (68) and terminating at the first package face (56), the bond site (78) being formed on a surface of the interposer (64) opposite the support post (74).

24. The semiconductor device package (300) of claim 21, wherein the lead frame (302) is etched to separate the leads (60) after the molding compound (54) is applied to the lead frame (302).

25. The semiconductor device package (50, 102, 300) of claim 21, wherein the wire (18) has a wedge width between about 1.2 to about 1.5 times a diameter of a portion of the wire (18) extending between the I/O pad (80) and the bond site (78).

26. A method of making a package for a semiconductor device (14), the method comprising:
forming a lead frame (52, 100, 302) from electrically conductive material, the lead frame (52, 100, 302) including a plurality of leads (60), wherein each of the leads (60) includes a bond site (78) formed thereon, each of the leads has a portion spaced apart from a bottom surface (56) of the package by a distance, each of the leads has a recess (126) formed therein adjacent a side surface (58) of the package, and a corner between the side surface and a bottom surface (56) of the package is removed to form a relief (128), the relief (128) having a height less than said distance;
electrically connecting I/O pads (80) on the semiconductor device (14) to the bond sites (78), the electrically connecting including:
wedge bonding a wire (18) to the I/O pad (80), and wedge bonding the wire (18) to the bond site (78); and
covering at least a portion of the semiconductor device (14), and at least a portion of the lead frame (52, 100, 302) with a molding compound (54).

27. The method of claim 26, wherein the wire (18) is made of aluminum or aluminum base.

28. The method of claim 26, wherein each lead includes:
an interposer (64) having opposing first and second ends (66, 68),
a board connecting post (70) extending from the interposer (64) proximate the first end (66), the board connecting post (70) having an end surface (72) distal from the interposer (64),
a support post (74) spaced apart from the board connecting post (70) and extending from the interposer (64) proximate the second end (68), the support post (74) having an end surface (76) distal from the interposer (64), the bond site (78) being formed on a surface of the interposer (70) opposite the support post (74), the support post (74) supporting the bond site (78) during the wedge bonding of the wire (18) to the bond site (78).

29. The method of claim 26, wherein the wedge bonding includes ultrasonic bonding.

30. The method of claim 26, wherein the wedge bonding includes thermosonic bonding.

31. The method of claim 26, wherein the wire (18) is wedge bonded to the I/O pad (80) before the wire (18) is wedge bonded to the bond site (78).

32. The method of claim 26, further comprising:
etching the lead frame (302) to separate the leads (60) after electrically connecting the I/O pads (80) on the semiconductor device (14) to the bond sites (78).

33. The method of claim 26, wherein the wire (18) has a wedge width between about 1.2 to about 1.5 times a diameter of a portion of the wire (18) extending between the I/O pad (80) and the bond site (78).

* * * * *